United States Patent [19]
Forney, Jr.

[11] Patent Number: 4,597,090
[45] Date of Patent: Jun. 24, 1986

[54] BLOCK CODED MODULATION SYSTEM

[75] Inventor: George D. Forney, Jr., Cambridge, Mass.

[73] Assignee: Codex Corporation, Mansfield, Mass.

[21] Appl. No.: 485,069

[22] Filed: Apr. 14, 1983

[51] Int. Cl.[4] ...................... H04B 14/02; H04L 27/20
[52] U.S. Cl. ...................................... 375/39; 375/42; 375/67; 332/9 R; 371/37
[58] Field of Search ................... 371/2, 37, 39, 40, 41, 371/43, 50; 375/38, 39, 42, 58, 67; 332/9 R, 10

[56] References Cited

U.S. PATENT DOCUMENTS

| | | | |
|---|---|---|---|
| 3,887,768 | 6/1975 | Forney, Jr. et al. | 375/39 |
| 3,955,141 | 5/1976 | Lyon et al. | 375/39 |
| 4,076,021 | 2/1978 | Csajka et al. | 332/9 |
| 4,084,137 | 4/1978 | Welti | 375/38 |
| 4,283,786 | 8/1981 | Okamura | 371/2 |
| 4,312,069 | 1/1982 | Ahamed | 371/37 |
| 4,404,532 | 9/1983 | Welti | 375/42 |
| 4,442,530 | 4/1984 | Parrish, Jr. et al. | 375/67 |

OTHER PUBLICATIONS

Ungerboeck, "Channel Coding with Multilevel/Phase Signals", IEEE Transactions on Information Theory, vol. IT-28, pp. 55-67, Jan. 1982.
Campopiano and Glazer, "A Coherent Digital Amplitude and Phase Modulation Scheme", IRE Transactions on Communication Systems, vol. CS-9, pp. 90-95, Mar. 1962.
Forney, "The Viterbi Algorithm", Proceedings of the IEEE, vol. 61, pp. 268-278, Mar. 1973.
Conway and Sloane, "Fast Quantizing and Decoding Algorithms for Lattice Quantizers and Codes", *IEEE Transactions on Information Theory*, vol. IT-28, pp. 22-232, Mar. 1982.
"Block Coding for Improved Modem Performance", *Canadian contribution*, (COM XVII-No. 112) to Study Group XVII of the International Telephone and Telegraph Consultative Committee (C.C.I.T.T.), Mar. 1983.

Primary Examiner—Benedict V. Safourek

[57] ABSTRACT

An improvement to a modulation system of the kind in which the encoder selects a codeword corresponding to a plurality of modulation signal points on the basis of a block of digital data, the available codewords for a given block being independent of the signal points corresponding to the codeword selected for any other block. In the improvement a constellation of available signals comprises groups with equal numbers of signals, and an encoder is arranged so that the group from which at least one signal point for a block is drawn depends on the group from which at least one other signal point for the block is drawn. In another aspect, the constellation includes inner signals and outer signals, one bit of data determines whether any of the signal points will be outer signals, and if so at least one other bit determines which will be an outer signal point.

66 Claims, 23 Drawing Figures

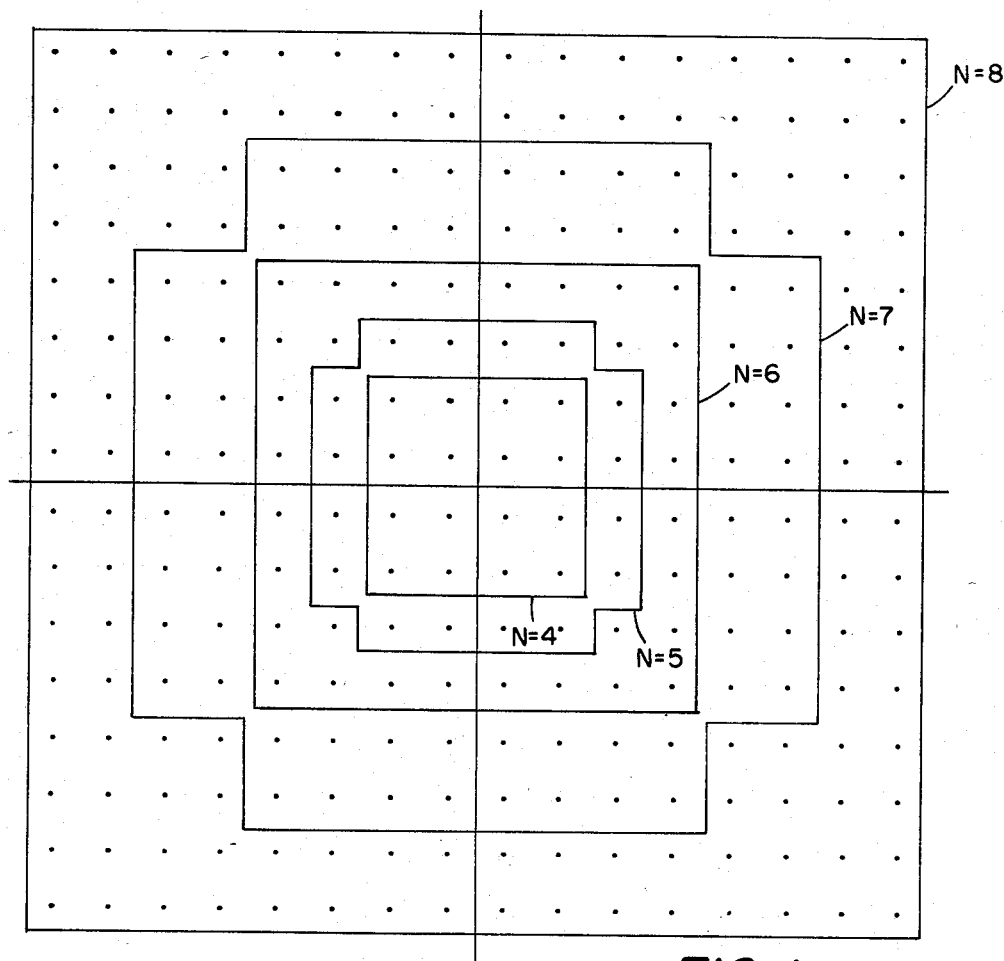
FIG. 1 (PRIOR ART)
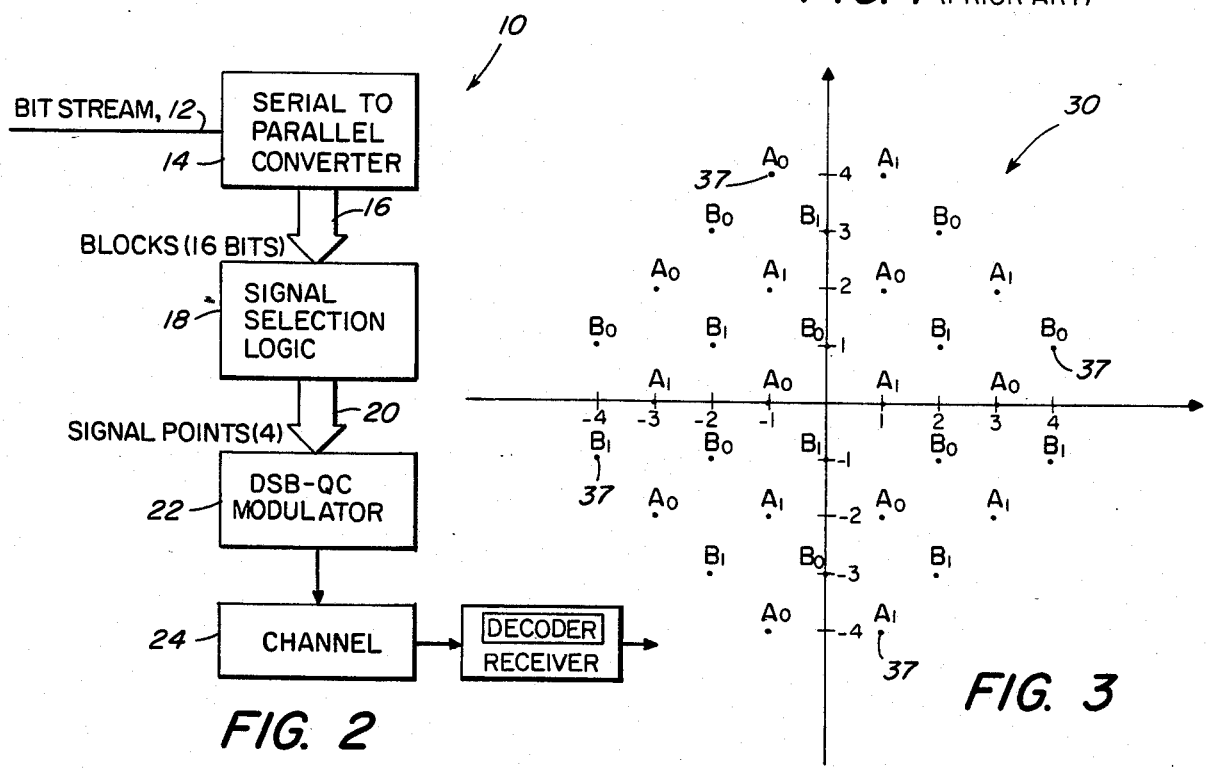
FIG. 2
FIG. 3

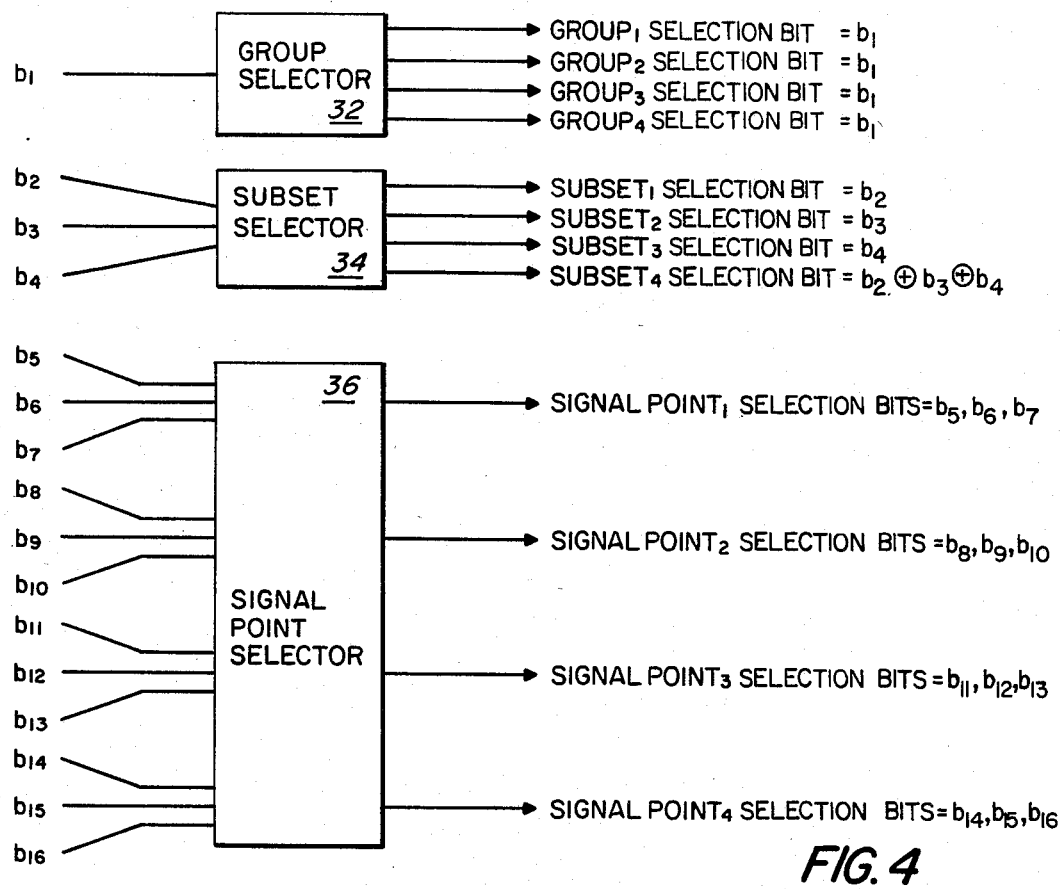
FIG. 4
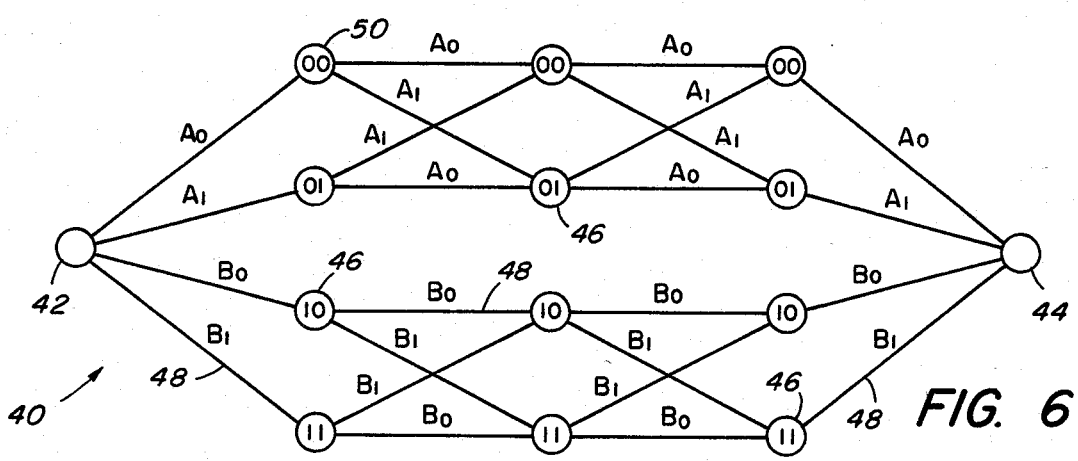
FIG. 5
FIG. 6

BLOCK CODED MODULATION SYSTEM

BACKGROUND OF THE INVENTION

This invention relates to high-speed data transmission over band-limited channels, such as telephone lines.

Modulation systems for such channels commonly use two-dimensional carrier modulation, generically called double-sideband-quadrature-carrier (DSB-QC) modulation. Such modulation systems are discussed, for example, in U.S. Pat. No. 3,887,768 (Forney/Gallager), incorporated herein by reference, which also shows an implementation of such a system.

Conventional DSB-QC systems are used to send an integer number (N) of bits in each modulation interval of T seconds in a nominal bandwidth of 1/T Hz. For example, some telephone line modems send 4 bits per modulation interval of 1/2400 sec. within a nominal bandwidth of 2400 Hz, thus achieving a 9600 bits per second (bps) data transmission rate. Modems for sending 6 bits per modulation interval to achieve 14,400 bps in a nominal 2400 Hz bandwidth are also available.

Such DSB-QC systems use signal constellations of $2^N$ signals for sending N bits per modulation interval. A family of such constellations with signals arranged on a regular rectangular grid is described in Campopiano and Glazer, "A Coherent Digital Amplitude and Phase Modulation Scheme," IRE Transactions on Communication Systems, Vol. CS-9, pp. 90–95, March 1962, incorporated herein by reference.

FIG. 1 shows the arrangement of signals in the Campopiano and Glazer constellations and the outer boundaries of those constellations for values of N from 4 through 8. Table I shows the so-called "required signal-to-noise ratio" $\overline{P}$ (defined in Campopiano et al. and in the Forney/Gallager patent) for the constellations of FIG. 1. Each unit increase in N corresponds to an increase in required signal-to-noise ratio of about a factor of two or 3.0 decibels (dB).

TABLE I

| (Campopiano and Glazer) | | | |
|---|---|---|---|
| N | S | P | (dB) |
| 4 | 16 | 10 | 10.0 |
| 5 | 32 | 20 | 13.0 |
| 6 | 64 | 42 | 16.2 |
| 7 | 128 | 82 | 19.1 |
| 8 | 256 | 170 | 22.3 |

N = number of bits sent per modulation interval
S = number of signals in signal constellation
P = required signal-to-noise ratio
(dB) = P measured in decibels For higher transmission speeds, so-called coded modulation techniques can provide improved resistance to noise and other channel impairments; that is, they can provide a reduction in required signal-to-noise ratio, or a so-called "coding gain".

In such coded systems, to send N bits per modulation interval, signal constellations having more than $2^N$ signals are used, and coding is used to introduce dependencies between modulation intervals so that the set of available signals from which a signal point can be selected in one modulation interval depends in general on the signal points selected for other modulation intervals.

In one coding technique for getting a coding gain (disclosed in Csajka et al, U.S. Pat. No. 4,077,027 and Ungerboeck, "Channel Coding with Multilevel/Phase Signals," IEEE Transactions on Information Theory, Vol. IT-28, pp. 55–67, January, 1982), the N bits appearing in each modulation interval are individually mapped into signal points selected from a constellation of $2^{N+1}$ signals. The signals in the constellation are organized into subsets such that the minimum distance between two signals belonging to one subset is greater than the minimum distance between any two signals in the constellation. The selection of the signal point for each N input bits is made to depend, in part, on the historical sequence of all previously selected signal points, as represented by the state of a finite state device in the encoder. This so-called trellis coding effectively permits only certain sequences of signal points to be transmitted, and the coded historical information carried by every signal point is exploited at the receiver by a maximum likelihood sequence estimation technique (e.g., one based on the Viterbi algorithm, as described in Forney, "The Viterbi Algorithm," Proceedings of the IEEE, Vol. 61, pp. 268–278, March, 1973, incorporated herein by reference).

A coding gain can also be realized using a block coded modulation system in which blocks of n input bits are sent in m modulation intervals, so that N=n/m bits are sent per modulation interval. For each block, m signal points are selected from a constellation having more than $2^N$ signals, a process which is equivalent to mapping each block into a code word selected from an available code word set of $2^n$ code words arranged in 2m-dimensional space (called simply 2m-space), with the 2m coordinates of each code word, taken two at a time, defining the respective pair of coordinates in two-dimensional space of the m signal points to be selected. The code word set from which the code word for any block may be drawn is independent of the signal points selected for any other block. At the receiver, the decisions on which signal points were sent are based on the received signal points for each block (the so-called received word), preferably using maximum likelihood decoding.

One method of block coding involves using a code word set arranged on a finite portion of a densely packed infinite geometrical lattice in 2m-space; see, for example, Conway and Sloane, "Fast Quantizing and Decoding Algorithms for Lattice Quantizers and Codes," IEEE Transactions on Information Theory, Vol. IT-28, pp. 227–232, March 1982, and the references cited therein, incorporated herein by reference. A representative system of this type is disclosed in "Block Coding for Improved Modem Performance," a Canadian contribution (Com XVII-No. 112) to Study Group XVII of the International Telegraph and Telephone Consultative Committee (C.C.I.T.T.), March 1983, incorporated herein by reference, which describes an 8-space code for sending 4 bits per modulaton interval with an asymptotic coding gain of 3.4 dB over the uncoded Campopiano and Glazer 16-signal constellation (defined by the N=4 boundary in FIG. 1).

SUMMARY OF THE INVENTION

The invention includes a family of block coded modulation systems of progressively greater complexity exhibiting progressively greater coding gain over uncoded systems.

In general, in one aspect the invention features, in such block coded modulation systems, the improvement in which the signal constellation includes groups having equal numbers of signals, and the encoder is arranged so that the group from which at least one signal point for a block is drawn depends on the group from which at least one other signal point for the block is drawn, whereby a coding gain over uncoded systems is achieved.

In preferred embodiments, the signals are arranged (e.g., on a rectangular grid) so that the minimum squared distance between two signals belonging to the same group is greater than (e.g., twice the distance) between two signals belonging to different groups; the signal points are two dimensional, the code words are 2m-dimensional, m being the number of signal points corresponding to each code word, and each block of digital data has mN bits; each block comprises a plurality of bits, and the groups from which the signal points for the block are drawn are determined by a single bit of the block; N is an integer, m is an even integer no smaller than 2, and the constellation has $1.5 \times 2^N$ signals; $N = r + \frac{1}{2}$, r being an integer, m is no smaller than 2, and the constellation comprises $2^{r+1}$ signals; the encoder is further arranged so that $m-1$ signal points for each block may be drawn from among all signals in the constellation, and the one remaining signal point for the block is drawn from a group that depends (e.g., by means of a single-parity-check code or a state-transition trellis) on the groups from which the $m-1$ signal points are drawn; m is 2; and N is 4 or $4\frac{1}{2}$.

In other embodiments, the groups each have subsets having equal numbers of signals, and the encoder is further arranged so that the subset from which at least one signal point for the block is drawn depends on the subset from which at least one other signal point for the block is drawn; the signals are arranged (e.g., on a rectangular grid) so that the minimum squared distance between two signals belonging to one subset is greater than (e.g., twice the distance) between two signals belonging to different subsets within the same group; the subsets from which the signal points for a block are drawn are determined based on a plurality of bits representing less than all of the digital data of the block; N is an integer, m is at least 4, and the constellation has $2^{N+1}$ said signals; $N = r + \frac{1}{2}$, r being an integer, m is an even integer no smaller than 4, and the constellation has $1.5 \times 2^{r+1}$ signals; the encoder is further arranged (e.g., by means of a single-parity-check code, a Hamming code, or a state-transition trellis) so that one signal point for each block may be drawn from among all signals in the constellation, m-2 of the signal points are drawn from groups that depend on the group from which that one signal point is drawn, and the single remaining signal point for the block is drawn from a subset that depends on the subsets from which the one signal point and the m-2 signal points are drawn; m is 4; and N is 4.

In other embodiments, the subsets each comprise classes having equal numbers of signals, and the encoder is further arranged so that the class from which at least one signal point for the block is drawn depends on the class from which at least one other signal point for the block is drawn; the minimum squared distance between two signals belonging to one class is greater than between two signals belonging to different classes within the same subset; each block has a plurality of bits, and the classes from which the signal points for the block are drawn are determined based on a plurality of bits representing less than all of the digital data of the block; m is 8; N is an integer and the constellation has $1.5 \times 2^{N+1}$ signals; $n = r + \frac{1}{2}$, r being an integer, m is 8, and the constellation comprises $2^{r+2}$ signals.

In other embodiments, the classes each comprise subclasses having equal numbers of signals, and the encoder is further arranged so that the subclass from which at least one signal point for the block is drawn depends on the subclass from which at least one other signal point for the block is drawn; the minimum squared distance between two signals belonging to one subclass is greater than (e.g., twice the distance) between two signals belonging to different subclasses within the same class; m is 12; N is an integer and the constellation has $2^{N+2}$ signals; the subclasses from which the signal points for the block are drawn are determined by the encoder based on a Golay code applied to at least one of the bits; m is 12 and N is 4; and the subclasses from which the signal points for the block are drawn are determined based on a plurality of bits representing less than all of the digital data of the block.

In other embodiments, there are means for selecting at least one signal point of a block on the basis of less than all digital data in the block; the constellation has quadruplets each having four signals located at the same distance from the origin but separated by 90° intervals about the origin, the digital data comprises bits, and at least two of the bits are quadrantally differentially encoded; the four signals belonging to each quadruplet are drawn from four different subsets; there is also a decoder arranged to decide which code word was sent based on maximum likelihood sequence estimation in accordance with the Viterbi algorithm; there is a demodulator having a decoder arranged to make tentative decisions about which signal point was sent prior to final decoding of all of the received signal points for a block, and the demodulator comprises adaptive control circuitry arranged to be responsive to the tentative decision; the signal points for each code word are drawn from the same group; the decoder is arranged to decide which code word was sent by first making a separate tentative decision based on code words whose signal points are drawn from each group, and thereafter a final decision based on the separate tentative decisions; selection of signal points for a block depends on a single-parity-check code based on at least one of the bits of the digital data; and the decoder is arranged to decide which code word was sent by first making a tentative decision as to each signal point in the code word without regard to whether the parity check is satisfied, and accepting the tentative decisions as the final decision, either without changes if the parity check is satisfied, or after changing the least reliable one of the tentative decisions if the parity check is not satisfied.

In another aspect, the invention features, in a modulation system for sending a block of digital data bits over a band-limited channel using a plurality of modulation signal points drawn from a two-dimensional constellation of available signals, the improvement in which the constellation has a plurality of inner signals, and a plurality of outer signals further from the origin than the inner signals, one bit of the digital data determines whether any of the plurality of signal points will be drawn from the outer signals, and if an outer signal will be drawn, at least one other bit of the digital data determines which of the plurality of signal points will be an outer signal point.

In preferred embodiments, there are $2^t$ signal points, the digital data comprises at least $t+1$ bits, there are S inner signals and $2^{-t}S$ outer signals, and t bits determine which signal point will be an outer signal point; $t = 1$; the block has $2N + 1$ bits and S is $2^N$, N being an integer;

N−1 of the bits determine which outer signal is drawn, and N bits determine which inner signal is drawn; N is 4; t is 2; each block has 4N+1 bits and S is $2^N$, being an integer; and N−2 of the bits determine which outer signal is drawn and N bits determine which inner signal is drawn.

The 4-space, 8-space, 16-space, and 24-space modulation systems of the invention respectively exhibit asymptotic coding gains of about 1.5, 3.0, 4.5, and 6.0 dB over uncoded systems that send the same number of bits per modulation interval through the same nominal bandwidth using DSB-QC modulation. The block coded systems of the invention are slightly inferior in performance to the best known prior art schemes (e.g., about 0.2 dB and 0.4 dB worse for 4-space and 8-space systems, respectively), but have substantial advantages in implementation. The invention uses constellations having relatively small numbers of signals. The encoding techniques are economical, simple, and easily implemented. Encoding delay is reduced because early signal points selected for a given block can be sent before encoding of the block has been completed. Decoding delay is small because received signal points can be finally decoded as soon as all signal points for a given block have been received. Useful tentative decoding decisions can be made even sooner. Non-integral numbers of bits per interval can be sent. Quadrantal differential encoding can be used to improve immunity to phase hits. Economical, simple, and easily implemented decoding techniques are made possible.

Other advantages and features of the invention will be apparent from the following description of the preferred embodiment, and from the claims.

DESCRIPTION OF THE PREFERRED EMBODIMENT

We first briefly describe the drawings.

Drawings

FIG. 1 is a diagram of a family of five prior art signal constellations.

FIG. 2 is a block diagram of modem apparatus.

FIG. 3 is a diagram of a signal constellation in accordance with the preferred embodiment.

FIG. 4 is a block diagram of a portion of the signal selection logic for the constellation of FIG. 3.

FIG. 5 is a table showing the correspondence between input bits and signal subsets.

FIG. 6 is a state-transition diagram (trellis) for use with the constellation of FIG. 3.

FIGS. 8, 12, 15, 17, and 20 are block diagrams of portions of the signal selection logic in accordance with alternate embodiments.

FIGS. 9, 10, 11, 14, 16, and 19 are diagrams of signal constellations in accordance with alternate embodiments.

Figure 16:
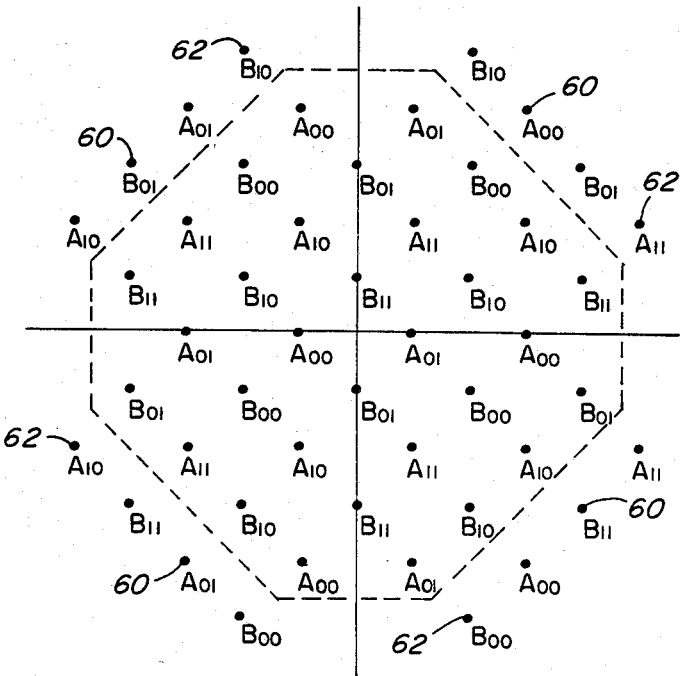
Figure 18:
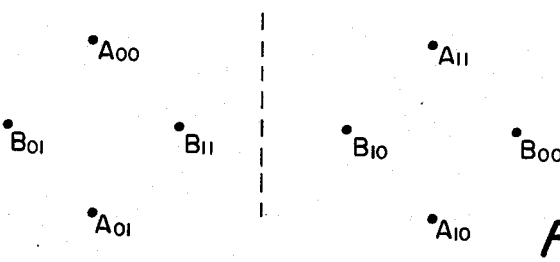
Figure 19:
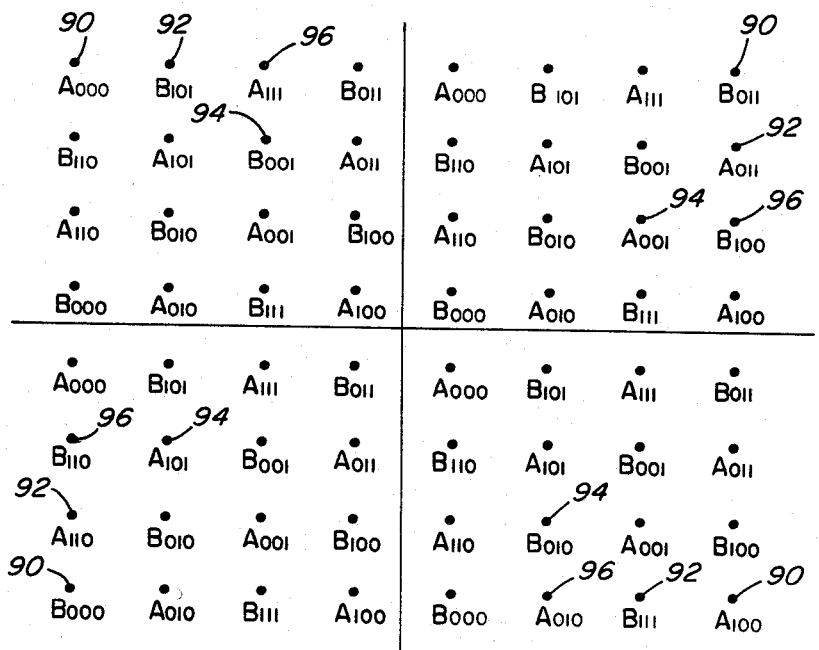
Figure 21:
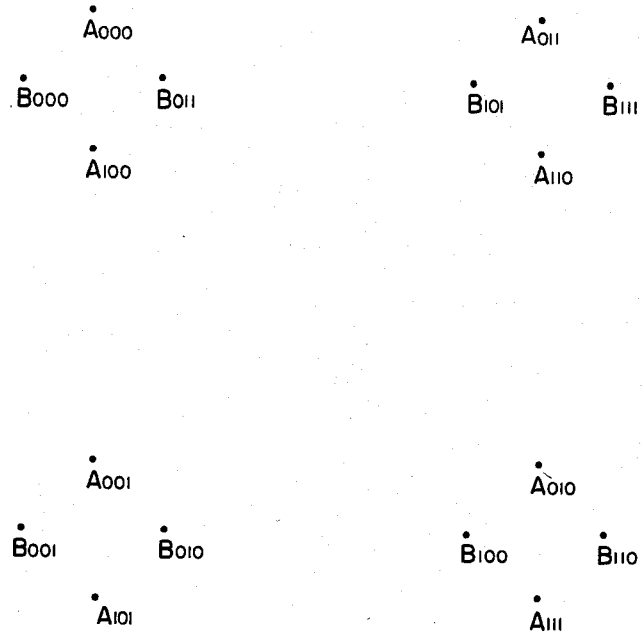

FIGS. 18 and 21 are diagrams of the relationships of signal quadruplets in the constellations of FIGS. 16 and 19, respectively.

Figure 13:
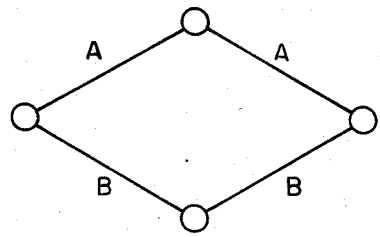
Figure 22:
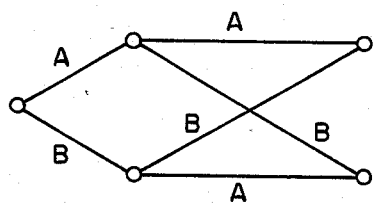
Figure 22:
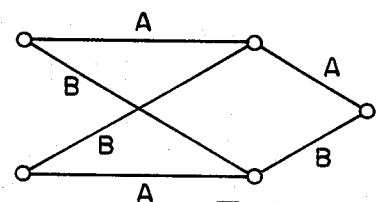
Figure 23:
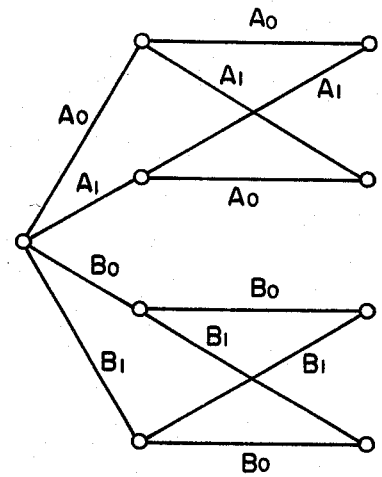
Figure 23:
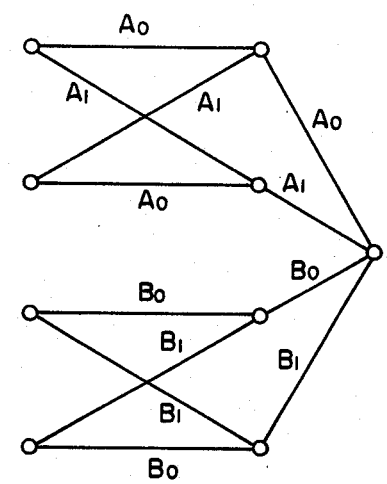

FIGS. 13, 22, and 23 are trellises for use with alternate embodiments.

In the following section, the preferred embodiment (an 8-space system sending 4 bits per modulation interval and achieving an asymptotic coding gain of 3.0 dB) is described first. Alternative embodiments thereafter described are other decoding and encoding techniques for 8-space block coded modulation systems; 8-space block coded systems for sending any integral number of bits per modulation interval; multidimensional signal structures for sending a non-integral number of bits per modulation interval (useful in both coded and uncoded systems); 4-space, 16-space, 24-space, and 2m-space block coded systems; and other embodiments.

Structure and Operation

In the preferred embodiment (an 8-space block coded modulation system for sending 4 bits per modulation interval), a block of 16 bits is sent in each 4 modulation intervals using a signal constellation having 32 signals.

Referring to FIG. 2, in transmitter 10 the bits appearing in an input bit stream 12 are grouped by serial/parallel converter 14 into 16-bit blocks 16 (i.e., n=16). Each block 16 is encoded by signal point selection logic 18 into a sequence of four (i.e., m=4) 2-dimensional signal points 20 (which are then used for conventional DSB-QC modulation by modulator 22 for transmission over channel 24).

Referring to FIG. 3, the signal points are selected from a two-dimensional signal constellation 30 having 32 signals (i.e., twice the number of signals (16) needed for uncoded modulation at 4 bits per modulation interval, as with the signal constellation shown within the N=4 boundary of FIG. 1). The 32 signals are arranged in a rectangular grid with integer coordinates, each signal point having one odd and one even coordinate (in an arrangement like the Campopiano and Glazer constellation shown within the N=5 boundary of FIG. 1, but rotated by 45°) and are divided into four disjoint subsets $A_0$, $A_1$, $B_0$, $B_1$) each having eight signals. The four subsets $A_0$, $A_1$, $B_0$, $B_1$ are arranged in two groups (A, comprising subsets $A_0$ and $A_1$, and B, comprising $B_0$ and $B_1$) of two subsets each. The arrangement of signals in the subsets and groups is such that the minimum squared distance ($d_o^2=2$) between any two signals on the plane (e.g., between an A signal and a B signal) is smaller than the minimum squared distance ($2d_o^2=4$) between any two signals in one group (e.g., between an $A_0$ signal and an $A_1$ signal), which is in turn smaller than the minimum squared distance ($4d_o^2=8$) between any two signals in the same subset (e.g., between an $A_0$ signal and another $A_0$ signal).

Signal selection logic 18 is arranged to select, for each block of input bits, a sequence of four signal points which are interdependent, i.e., the signal group and/or subset from which at least some of the signal points for a given block may be selected depends in part on at least one of the other signal points selected for that block. The code word set from among which the code word for a given block may be drawn is independent of the signal points selected for any other block.

Each of the 32 constellation signals can be uniquely specified by a total of 5 bits: one bit naming the group from which it is taken, one bit naming the subset within that group, and three bits naming which of the eight signal points within the named subset is to be selected. Thus the four signal points for a block could be uniquely specified by a total of 20 bits. However, the block has only 16 input bits on which to base the selections.

Referring to FIG. 4, the group, subset, and signal point selection information needed to select each of the four signal points for each block is derived from the 16 input bits ($b_1$-$b_{16}$) as follows.

Group selector 32 uses bit $b_1$ (called the group bit) to determine the one group from which all four signal points for a given block is to be drawn. (The designation $group_1$ refers to the group from which the first signal point is selected; and so on.) $Group_1$ through $group_4$ are therefore always the same group for a given block. For example, if $b_1=0$ all four signal points would be selected from group A; if $b_1=1$, all would be from group B.

Subset selector 34 uses bits $b_2$, $b_3$, and $b_4$ to determine from which subsets of the selected group each of the four signal points is to be drawn. Bits $b_2$, $b_3$, and $b_4$ respectively determine $subset_1$, $subset_2$, and $subset_3$. For example, in a block for which the signal points are from group A, if $b_2=0$ the first signal point would be selected from subset $A_0$, otherwise (if $b_2=1$) from $A_1$. $Subset_4$ is a parity bit generated by subset selector 34 such that bits $b_2$, $b_3$, $b_4$ and the parity bit (called subset bits) include an even number of 1 bits. Thus the subset bits can be viewed as coded bits derived by a (4, 3) single-parity-check code from the input bits $b_2$–$b_4$. Referring to FIG. 5, the four possible combinations of subset and group selection bits thus correspond to the indicated four signal point subsets. The remaining bits ($b_5$–$b_{16}$) taken three at a time (called signal point bits) specify which particular four signal points ($signal\ point_1$-$signal\ point_4$) are to be drawn by signal point selector 36 from the selected 8-point subsets. Thus group selector 32 and subset selector 34 assure that the group from which at least one of the signal points for a given block is selected depends on the group from which at least one of the other signal points for the block is selected (thereby reducing, after the first signal point, the number of groups from which later signal points for a block can be selected), and to assure that the subset from which at least one of the signal points is selected depends on the subset from which at least one of the other signal points is selected (thereby reducing, after the first signal point, the number of subsets from which later signal points for a block can be selected).

Although the signal selection (coding) has been explained as the selection of four successive signal points from a 2-dimensional signal constellation, it could also be viewed as an 8-space block coded modulation technique in which a set of $2^{16}$ code words are arranged on a lattice in 8-space, and coding consists of selecting one of the code words for each block. The eight coordinates of the selected code words could then be taken two at a time to specify the four two-dimensional signal points to be used for carrier modulation.

The required signal-to-noise power ratio for the 32-point signal constellation of FIG. 3 is $\overline{P}=10$, the same as for the N=4 signal constellation of FIG. 1. The minimum squared distance between code words in 8-space is 8, double the minimum squared distance (4) between signals in the N=4 FIG. 1 constellation (in which each signal has odd integer coordinates), providing an asymptotic coding gain of a factor of 2, or 3.0 db.

That the minimum squared distance between code words in 8-space is 8 can be seen as follows. Two different code words which have the same group bit and the same subset bits must differ in at least one of their respective four signal points. Because those two different signal points must be drawn from the same subset, and signal points in the same subset have a minimum squared distance of 8 on the two-dimensional plane, the two code words in 8-space likewise have a minimum squared distance of 8.

Similarly, two code words which have the same group bit but different subset bits must differ in at least two of their subset bits (because the subset bits have even parity). At least two of their respective four signal points must therefore differ in each case by a minimum squared distance of 4 (the minimum squared distance on the two-dimensional plane between two signal points chosen from a given group) for a total minimum squared distance of 8.

Likewise, two code words which have different group bits differ in all four of their signal points, and the minimum squared distance between two signal points on the two-dimensional plane is 2 for a total minimum squared distance of 8. Thus, in all possible cases, the minimum squared distance is 8.

The theoretical coding gain of 3.0 dB is partially offset by the effect of the error event probability coefficient (see Forney Viterbi article), which can be estimated as follows. In 8-space, each code word has up to 240 nearest neighbors (16 which have the same group and subset bits, 96 which have the same group bits but different subset bits, and 128 which have different group and subset bits). But because code words near the outer boundary of the code word set have fewer neighbors, the average code word only has about 180 near neighbors. The error event probability coefficient per modulation interval is therefore of the order of 180/4=45, corresponding to a fraction of a decibel of loss in performance for error probabilities of interest.

At the receiver, decoding of the four signal points into the corresponding bit stream is optimally done by maximum likelihood decoding, i.e., picking the one code word which is most likely to have been sent, given the 8-space received word determined by the four received two-dimensional signal points.

For each of the received two-dimensional signal points, the decoder (FIG. 2) tentatively finds (by conventional slicing in two-dimensional space) the closest (in Euclidean distance) signal from the A group and the closest signal from the B group to the received signal point, noting, on a running basis, which of the coordinates of the tentatively selected signals for each group is least reliable (i.e., has the greatest apparent error). The subset bits of the four tentatively selected A signals are checked for parity. If parity checks, then the four tentatively selected A signals define the closest code word in the A group to the received word. If parity fails to check, the closest A code word is found by changing the least reliable coordinate to the coordinate of the next closer A signal, which (because of the arrangement of the subset points in the constellation) will always cause a change of that signal from an $A_0$ to an $A_1$ signal (or vice versa), and thus yield a code word of correct parity. An analogous slicing and parity checking sequence finds the closest B code word to the received word.

The final decoding decision entails choosing whether the previously determined closest A code word or closest B code word is closer (in overall Euclidean distance) to the received coordinates in 8-space. The choice may be made by computing the sum of the squared coordinate differences between each of the two code words and the received word and comparing the sums.

Decoding thus requires only slicing (twice) in each coordinate, storing (for A and B code words respectively) the location and magnitude of the largest apparent error so far, accumulating the Euclidean distances for the best code words from each group, checking the parity of each best code word (and changing one coordinate in each code word, if needed, thereby changing the Euclidean distance for that word), and comparing the Euclidean distances for the resulting two best code words to select the better one. This decoding method may be readily and simply implemented (by conventional techniques) using a programmable microprocessor.

The block coded modulation system can be made transparent to 90° phase rotations between the received carrier and the transmitted carrier using quadrantal differential coding on a block basis. The signal constellation of FIG. 3 is arranged in quadruplets of signals having the same radii but separated by 90° phase differences, each quadruplet having one signal from each subset, so that a 90° clockwise rotation translates, within each quadruplet, the $A_0$ signal to the $B_0$ signal, the $B_0$ signal to the $A_1$ signal, the $A_1$ signal to the $B_1$ signal, and the $B_1$ signal to the $A_0$ signal; and analogous translations occur for 180° and 270° rotations. For example, the signals denoted 37 in FIG. 3 form such a quadruplet. Referring to FIG. 5, if each signal's subset and group bits are taken together as a 2-bit integer, 90° clockwise rotation of any signal corresponds to an increment of 1 (modulo 4) in the value of that integer. Quadrantal differential coding can then be accomplished by assigning the same three signal point bits to all four of the signals within each quadruplet, and coding the subset and group bits for each signal point in a code word by differential four-phase coding, using for example the subset and group bits of the last signal point of the previous code word as the reference.

If $(x_1, x_2)$ denotes the differentially encoded subset and group bits of the last signal point of the previous code word, and $(y_1, y_2)$ denotes the subset and group bits of a signal point in the current code word (before differential encoding), then $(z_1, z_2)$, the differentially encoded subset and group bits of that signal point in the current code word, is determined by adding $(x_1, x_2)$ to $(y_1, y_2)$ as two-bit integers, modulo four. Because $z_2 = x_2 \oplus y_2$, the same differentially encoded group bit is used for all signal points in the block. At the receiver, assume that both the previous and the current code words are correctly decoded (except for a possible phase rotation of an integral multiple of 90°). If the received bits are denoted $(x_1', x_2')$ and $(z_1', z_2')$, then $(y_1, y_2)$ is determined by subtracting $(x_1', x_2')$ from $(z_1', z_2')$ as two-bit integers, modulo four. The resulting $(y_1, y_2)$ value will then be correct even if both $(x_1', x_2')$ and $(z_1', z_2')$ have been advanced by p modulo 4 as a result of a $p \times 90°$ phase rotation.

Because decoding of a code word can be finished as soon as all four received signal points are determined, the decoding delay and error propagation of this block coding system are strictly limited to four modulation intervals. Further, because tentative signal point decisions (made before all four signal points have been received) are only about 3 dB less reliable than in the uncoded 16-signal constellation of FIG. 1, those tentative decisions may be used to update adaptive equalizers and other tracking loops in the receiver without even waiting for all four signal points to be received. The tentative decisions are made by finding the closest signal on the constellation of FIG. 3 to each received signal point, which can be accomplished by rotating the coordinates 45° with respect to the signal constellation, followed by conventional slicing in each of the two rotated coordinates. At the transmitter, transmission can begin as soon as five bits ($b_1, b_2, b_5, b_6, b_7$) have been collected, thereby reducing the encoding delay which would exist for other kinds of block coding in which all of the bits of the block would have to be collected before encoding could begin.

OTHER EMBODIMENTS

Other Decoding and Encoding Techniques for 8-Space Block Coded Systems

In another embodiment, maximum likelihood decoding can be accomplished by applying the Viterbi algorithm (in a manner described in Forney's Viterbi article, cited above).

Referring to FIG. 6, in order to apply the Viterbi algorithm, the encoding process can be illustrated by a finite-length 4-state trellis 40. The trellis shows from left to right the state of the encoder at five successive times, beginning with a node 42 reflecting the time immediately before encoding of a new block begins and ending with a node 44 reflecting the time just after the encoding of that block has been completed. In between nodes 42, 44 are shown four modulation intervals separated by three time instants, each such instant being represented by a column of four nodes 46 corresponding to the four states which the encoder can occupy at that instant. Branches 48 from each node to the next nodes to its right correspond to modulation intervals and reflect transitions of the state of the encoder which can occur as a signal point is selected. Each branch 48 is labeled with a letter to indicate the subset corresponding to the signal point associated with that modulation interval. Each node 46 is marked with a two-bit value, the first bit reflecting the group bit for all signal points for that block (i.e., 0=A, 1=B), and the second bit reflecting the value of the accumulated parity check subset bit as of that time.

The encoder begins at a common node 42 (reflecting that the encoder's state does not depend on historical information). From node 42 the encoder branches to one of four states depending on the group and subset bits of the first selected signal point. For example, if the first selected signal point is from subset $A_0$, the next encoder state is at node 50. For the next two signal points, the encoder state stays in the half of the trellis defined by the group bit of the first signal point, but switches states (from one parity to the other) in accordance with the transitions shown. Only 16 of the 32 signals in the constellation are available for selection of the second and third signal. The transition to the final node 44 is determined by the parity state of the encoder (e.g., an $A_1$ or $B_1$ point is sent if the parity state is 1, otherwise an $A_0$ or $B_0$ point is sent). Only a subset of 8 of the 32 signals in the constellation are available for selection of the fourth signal point, and that subset depends on the first three selected signal points. Thus the paths through the trellis define the possible combinations of subsets from which the sequence of four signal points for each block can be chosen.

In decoding each received word, in accordance with the Viterbi algorithm, decisions are first made (using conventional slicing in two dimensions, with the coordinate axes rotated 45°) of which of the eight signals in each of the four subsets is closest to each received signal point. A branch in trellis 40 (corresponding to each subset) is then associated with the closest signal in its corresponding subset, and the so-called metric of each branch is the squared distance between the received signal point and the corresponding closest signal associated with that branch. The remaining steps of the Viterbi algorithm decoding proceed as described in Forney's Viterbi article, cited above. A final decoding decision is possible after four modulation intervals, at which time all trellis branches converge to a single node 44.

In another embodiment, the input bits may be coded (using a Hamming code) into coded bits which are used to select the subsets from which the signal points may be selected.

Four bits in each block, $b_1$-$b_4$, rather than being used in a group selector and subset selector (as shown in FIG. 4) to select the group and subset from which each signal point is to be selected, are encoded into 8 coded bits $z_1$-$z_8$ using the following conventional extended (8, 4) binary Hamming code (Hamming codes are discussed, e.g., in Berlekamp, Algebraic Coding Theory, McGraw-Hill, 1968, incorporated herein by reference):

$z_1 = b_2$ $z_2 = b_1 \oplus b_2$ $z_3 = b_3$ $z_4 = b_1 \oplus b_3$ $z_5 = b_4$ $z_6 = b_1 \oplus b_4$ $z_7 = b_2 \oplus b_3 \oplus b_4$ $z_8 = b_1 \oplus b_2 \oplus b_3 \oplus b_4$ which can be generated using, for example, the following generator matrix (having minimum Hamming distance 4):
01010101
11000011
00110011
00001111

Bits $z_1$-$z_8$ are taken in pairs to select the subsets of FIG. 3 from which the four signal points are to be drawn in accordance with the following table:

| Bit Pair | Subset |
|---|---|
| 00 | $A_0$ |
| 01 | $B_0$ |
| 10 | $B_1$ |
| 11 | $A_1$ |

The Hamming distance ($d_H$) between bit pairs is then equal to half the minimum squared distance between signals in the corresponding subsets, i.e., $d^2(A_0, B_0) = d^2(A_0, B_1) = d^2(A_1, B_0) = 2 (A_1, B_1) = 2$, corresponding to $d_H(00, 01) = d_{H2}(00, 10) = d_H(11, 01) = d_H(11, 10) = 1$; and $d^2(A_0, A_1) = d^2, (B_0, B_1) = 4$, corresponding to $d_H(00, 11) = d_H(01, 10) = 2$.

The minimum squared distance between code words in 8-space is then 8. For if two code words correspond to different Hamming coded bits $z_1$-$z_8$, then these bits differ in at least 4 places, which (because the Hamming distance is half the subset distance, as just described) implies that the squared distance between the code words is at least 8. Alternatively, two code words corresponding to the same Hamming coded bits $z_1$-$z_8$ have signal points all in the same subsets in each modulation interval; in at least one interval the signal points must be different, and since they belong to the same subset the minimum squared distance between them is 8.

In other embodiments, the selection of the four subsets to be used in the four modulation intervals can be done by any method (in addition to the three already described) which produces minimum squared distance of 8 between code words (based on the distance properties of the subsets in 2-space). The 12 bits used to select the particular signal point for each modulation interval (or the original 16-bit block) can be arbitrarily transformed. The constellation can be any signal constellation that can be divided into four eight-point subsets wth the required distance properties.

8-Space Block Coded Systems for Sending Any Integral Number of Bits per Modulation Interval In other embodiments, any number of bits (N) per modulation interval can be sent by using a signal constellation on a rectangular grid having $2^{N+1}$ signals (e.g., constellations such as the ones shown in FIG. 1), divided into four equal subsets (each having $2^{N-1}$ signals) and arranging the signals so that alternate signals fall respectively in groups A and B, and alternate signals within each group fall respectively in subsets ($A_0$, $A_1$; $B_0$, $B_1$). Four bits of each block of 4N bits are used to select the four subsets by any method (including those described above) which assures a minimum squared distance between code words of $4d_o^2$ (where $d_o^2$ is the minimum squared distance between signals in the constellation). The remaining 4 (N−1) bits are used to select which signals within the selected subsets are to be sent in each interval.

Table II shows the required signal-to-noise ratios $\overline{P}$ for values of N from 3 through 7 using the constellations of FIG. 1 with S signal points and the 8-space block coding system described above:

TABLE II

| N | S | $\overline{P}$ | (dB) |
|---|---|---|---|
| 3 | 16 | 2.5 | 4.0 |
| 4 | 32 | 5 | 7.0 |
| 5 | 64 | 10.5 | 10.2 |
| 6 | 128 | 20.5 | 13.1 |
| 7 | 256 | 42.5 | 16.3 |

Compared with the uncoded systems treated in Table I, about 3 dB of coding gain is achievable for any integer value of N, using a signal constellation of size $2^{N+1}$ rather than $2^N$.

Multidimensional Signal Structures for Sending a Non-Integral Number of Bits per Modulation Interval In other embodiments, signal systems of multiple (at least four) dimensions are used for sending a non-integral number (N) of bits per modulation interval, where N is of the form N=r+f (r an integer, f a fraction between 0 and 1). Such systems send blocks of bits (each block longer than one modulation interval), and are efficient for use in uncoded systems (as well as coded systems) because their required signal-to-noise ratio is only about f−3 dB more than for a comparable FIG. 1 signal constellation for sending r bits per modulation interval, and because the number of signals in the constellation is about $(1+f)2^r$.

Figure 7:
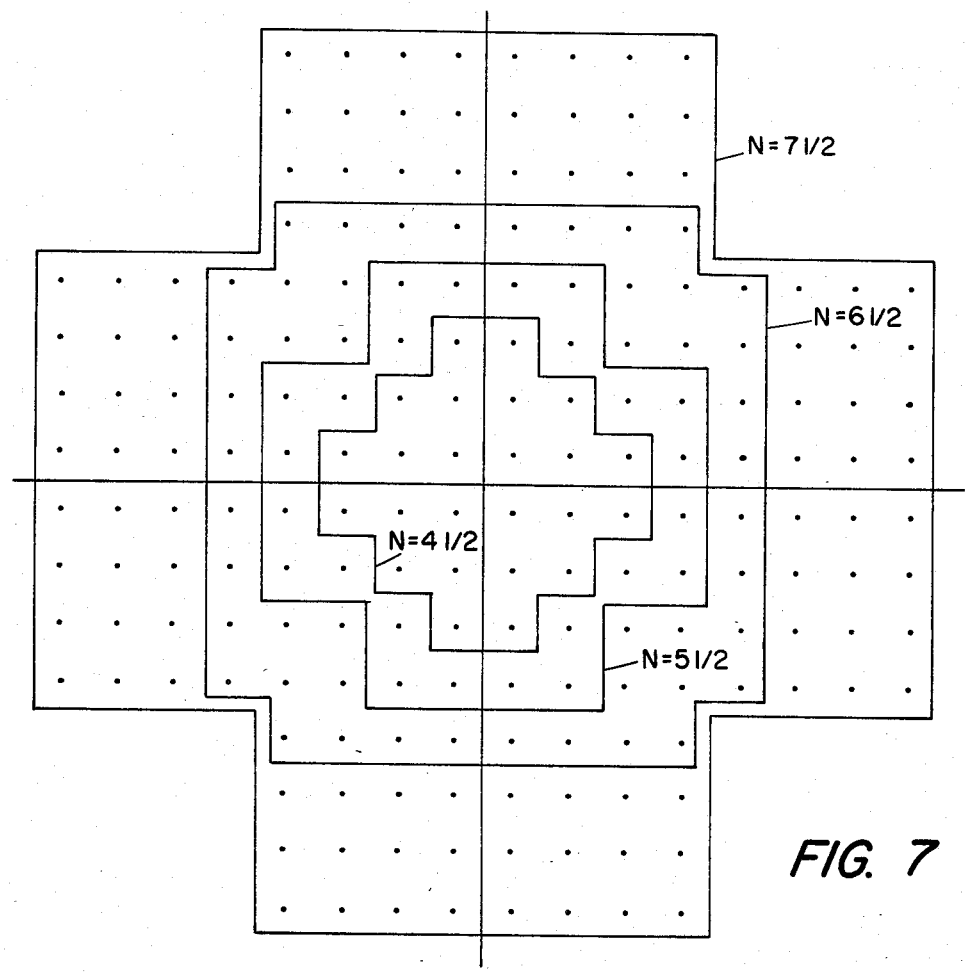
FIG. 7 is a diagram of a family of four signal constellations in accordance with an alternate embodiment.

Referring to FIG. 7, signal constellations for use in sending $N = r + \frac{1}{2}$ bits per modulation interval each comprise the $2^r$ signals in the $N=r$ constellation of FIG. 1 (called inner signals) plus an additional $2^{r-1}$ signals (called outer signals) generally arranged further from the origin, on the same grid, and with the same symmetries, as the inner signals.

To send blocks of $2r+1$ bits in two modulation intervals, a first bit of the $2r+1$ bits determines whether any outer signal is to be sent. If not, the remaining $2r$ bits taken $r$ at a time determine the two inner signals for the two intervals. If so, a second bit determines whether the outer signal will be sent in the first or second modulation interval, $r-1$ bits determine which outer signal, and the remaining $r$ bits determine which inner signal is sent in the other interval. The average power required to send both signal points will be $\frac{3}{4}$ the average power required to send inner signals (which are sent on average $\frac{3}{4}$ of the time) plus $\frac{1}{4}$ the average power required to send outer signals (which are sent on average $\frac{1}{4}$ of the time).

For example, $4\frac{1}{2}$ bits per modulation interval ($r=4$) can be sent in 2 modulation intervals using the constellation having 24 signals (within the $N=4\frac{1}{2}$ boundary of FIG. 7) divided into an inner group of 16 signals, arranged as shown in FIG. 1 ($N=4$) and an outer group of 8 signals, with the arrangement of signals exhibiting quadrantal symmetry.

Figure 8:
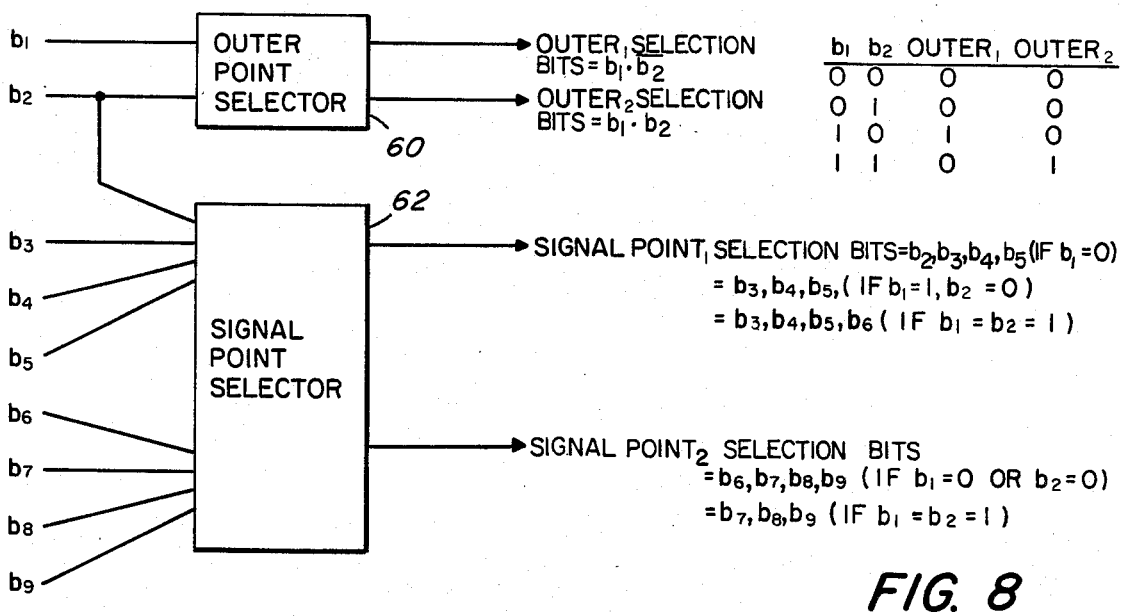

Referring to FIG. 8, in the signal selection logic, bit $b_1$ is used by outer point selector 60 to determine whether none or one of the two selected signal points will be an outer signal. If one will be, then bit $b_2$ is used by selector 60 to determine which interval it will be in, and bits $b_3$–$b_9$ are used by signal point selector 62 to select the outer and inner signals as shown in FIG. 8. If neither signal point is to be an outer signal, then bits $b_2$–$b_5$ and $b_6$–$b_9$ are used by signal point selector 62 to select respectively the two inner signals. In FIG. 8, the value $OUTER_1$ represents whether an inner point ($OUTER_a=0$) or an outer point ($OUTER_1=1$) will appear in the first interval, and the value $OUTER_2$ represents whether an inner point ($OUTER_2=0$) or an outer point ($OUTER_2=1$) will appear in the second interval. The table in the upper right of FIG. 8 sets forth the relationship between bits $b_1$ and $b_2$ and the values $OUTER_1$ and $OUTER_2$).

The average power required to send inner points is 10.0, and to send outer points 26.0. The required signal-to-noise ratio is therefore 14 (11.5 dB), which is 1.5 dB more than the requirement for sending 4 bits per interval using the 16-signal constellation of FIG. 1.

Table III shows the numbers of constellation signals S and the required signal-to-noise ratios $\bar{P}$ for sending half-integer numbers N (between $4\frac{1}{2}$ and $7\frac{1}{2}$) of bits per interval using this system with the constellations of FIG. 7:

TABLE III

| N | S | $\bar{P}$ | (dB) |
|---|---|---|---|
| $4\frac{1}{2}$ | 24 | 14 | 11.5 |
| $5\frac{1}{2}$ | 48 | 28.5 | 14.5 |
| $6\frac{1}{2}$ | 96 | 57 | 17.6 |
| $7\frac{1}{2}$ | 192 | 116 | 20.6 |

In other embodiments, any number of bits per interval of the form $N = r + 2^{-t}$ ($t$ an integer) can be sent by adding to inner signals (consisting of the $2^r$ signals in an uncoded signal constellation), outer signals (consisting of $2^{r-t}$ signals located as close to the origin as possible consistent with maintaining an overall rectangular grid exhibiting quadrantal symmetry). The input bits are taken in blocks of $2^t r + 1$ and determine $2^t$ signal points for transmission. Of the $2^t r + 1$ bits in each block, one bit determines whether any of the signal points should be an outer signal. If so, then $t$ additional bits are used to determine in which of the $2^t$ intervals an outer signal will be sent, $r-t$ bits determine which outer signal will be sent, and $r(2^t - 1)$ bits, taken $r$ at a time, are used to select the inner signals to be sent in the other $2^t - 1$ intervals. If none of the signal points is to be an outer signal, the remaining $2^t r$ bits, taken $r$ at a time, are used to select the inner signals to be sent in the $2^t$ intervals. The required signal-to-noise ratio for such a block coding system is about $3 \times 2^{-t}$ dB greater than for an uncoded system in which a signal constellation having $2^r$ signals is used to send $r$ bits per interval.

Figure 9:
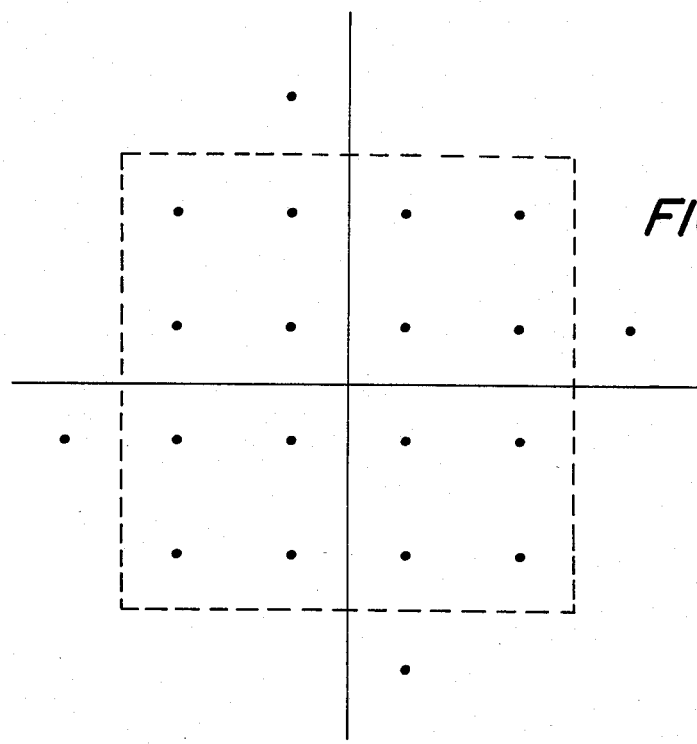

For example, referring to FIG. 9, to send $4\frac{1}{4}$ bits per interval, in 17-bit blocks each 4 intervals long ($r=4$, $t=2$), a signal constellation having 16 inner signals and 4 outer signals is used. One input bit determines whether any of the four output signal points will be an outer signal. If so, two further bits determine in which of the four intervals the outer signal will be sent, two further bits select that outer signal, and 12 bits, taken 4 at a time, select the three inner signals. If no outer signal is to be sent, the remaining 16 bits, taken 4 at a time, are used to select the four inner signals. The required signal-to-noise ratio to send $4\frac{1}{4}$ bits per interval is $7/8 \times 10 + \frac{1}{8} \times 26 = 12$ (10.79 dB) or 0.79 dB more than to send 4 bits per interval in an uncoded system. (In this case, the outer signals might be moved to the axes to save a little more power, if maintenance of the grid is not required.)

In other embodiments, a system that sends $N=r+f$ bits per modulation interval using a constellation having $S$ signals can be extended to one sending $N' = r+f+2^{-t}$ bits per interval using a constellation having $(1+2^{-t})S$ signals. To the S original signals are added $2^{-t}S$ additional signals (assuming $2^{-t}S$ is an integer, and a multiple of 4 if quadrantal symmetry is to be maintained). These additional signals are further segmented into subgroups in the same proportion as in the unextended system; i.e., each subgroup is $2^{-t}$ as large as in the unextended system, and can therefore be specified by $t$ fewer bits. For example, if in the unextended system there are $S = 1.5 \times 2^r$ signals divided into $2^r$ inner signals and $2^{r-1}$ outer signals, then in the extended system the $2^{-t}S$ additional points are divided into $2^{r-t}$ additional inner signals and $2^{r-t-1}$ additional outer signals.

Input bits are grouped into blocks of $2^t r + 2^t f + 1$ bits (assuming $2^t f$ is an integer) and used to determine $2^t$ signal points. One of these bits determines whether any of the additional $2^{-t}S$ signals is to be used; if not, the remaining $2^t(r+f)$ bits are used to determine the $2^t$ signal points using the unextended system; if so, then $t$ bits are used to determine which interval uses an additional signal and the remaining $2^t(r+f) - t$ are used to determine which signals, using the unextended system, except that in the selected interval one of the additional signals is used and is selected with $t$ fewer bits because the corresponding subgroups are all a factor of $2^{-t}$ smaller.

In this iterative fashion, systems that send $N = r+f$ bits where $f$ is any binary fraction of the form
$$f = 2^{-t_1} + 2^{-t_2} + \ldots + 2^{-t_k}, \quad t_1 < t_2 < \ldots < t_k$$
can be built up, with signal constellations of $S=2^r(1+2^{-t_1})(1+2^{-t_2})\ldots(1+2^{-t_k})$
signals (provided that $t_1+t_2+\ldots+t_k$ is less than or equal to r, or to r+2 if quadrantal symmetry is desired).

4-Space Block Coded Systems

In other embodiments, 4-space block coded modulation systems send an integer number (N) of bits per modulation interval using signal constellations of the type of FIG. 7, or a half-integer number ($N=r+\frac{1}{2}$) bits per interval using constellations of the type of FIG. 1.

Figure 10:
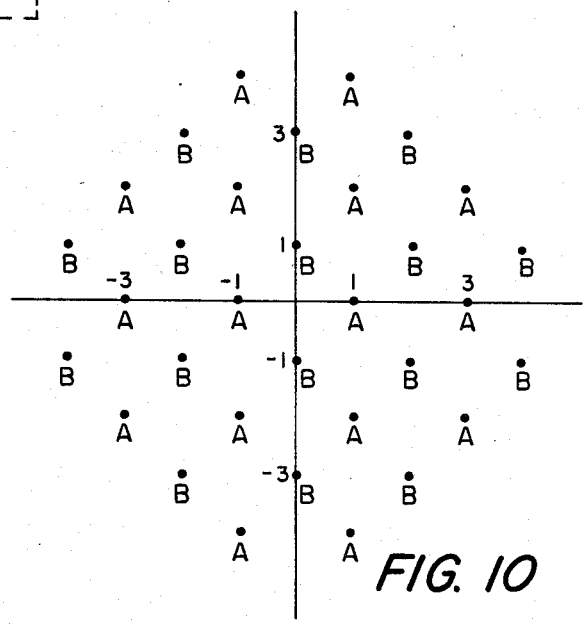
Figure 11:
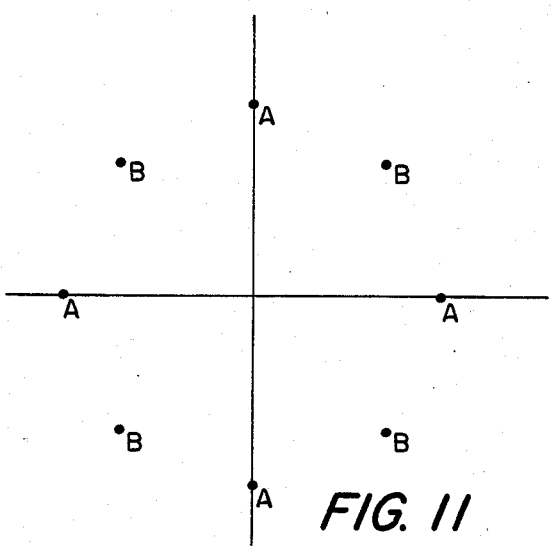

To send a half-integer number of bits per interval, 2r+1 bits are grouped into a block which determines two signal points from a constellation having $2^{r+1}$ signals. The constellation is divided into two groups A and B of equal size, the two groups respectively containing alternate signals. For example, in FIG. 10 a constellation having 32 signals is divided into two 16-signal groups. As another example (not using a rectangular grid), FIG. 11 shows an 8-signal (8-phase) constellation divided into two 4-signal groups. The minimum squared distance between signals belonging to the same group ($d^2(A,A)=d^2(B,B)$) is at least twice as great as the minimum squared distance between signals belonging to different groups ($d^2(A,B)=d_o^2$). In FIG. 10 (and in any rectangular grid structure), $d^2(A,A)=2d^2(A,B)$; in FIG. 11 $d^2(A,A)=3.4d^2(A,B)$.

One bit from each block (the group bit) determines whether both signal points will be from group A or both from group B. The remaining $2^r$ bits taken r at a time determine which of the $2^r$ A points or B points is selected for each interval. The minimum squared distance between code words must be at least $2d_o^2$, because (a) between two code words that have different group bits (e.g., one group A code word and one group B code word), there must be a squared distance of at least $d^2(A,B)=d_o^2$ in each of the two intervals, while (b) between two code words with the same group bit, there must be a squared distance of at least $d^2(A,A)=d^2(B,B) \geq 2d_o^2$ in one interval. However, the power used is only that required for sending r+1 bits per interval uncoded with a minimum squared distance of $d_o^2$, which is about the same as for an uncoded system sending r bits per interval with a minimum squared distance of $2d_o^2$. Thus, 4-space coding allows sending $r+1\frac{1}{2}$ bits per interval at about the same required signal-to-noise ratio as an uncoded system sending r bits per interval.

An embodiment using the FIG. 10 32-signal constellation to send $4\frac{1}{2}$ bits per modulation interval is as follows.

Figure 12:
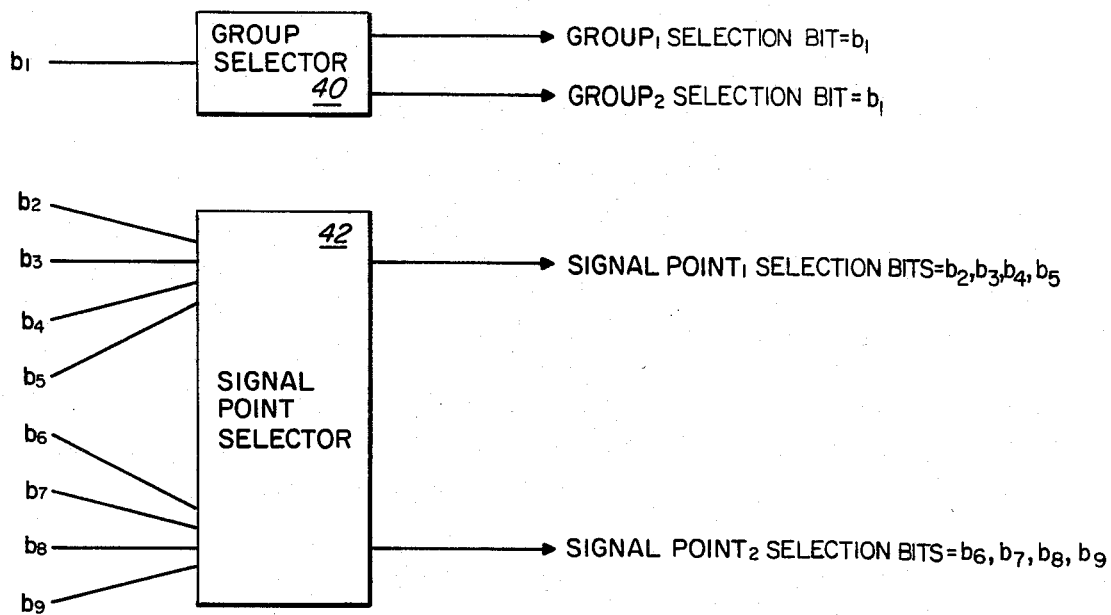

Referring to FIG. 12, in the signal selection logic, the first input bit ($b_1$) is used by group selector 40 to determine the groups (group$_1$ and group$_2$) from which both signal points will be selected, input bits $b_2$ through $b_5$ are used by signal point selector 42 to select signal point$_1$ from the named group, and input bits $b_6$ through $b_9$ to select signal point$_2$ from the named group.

The minimum squared distance between code words is 4, and the required signal-to-noise ratio $\overline{P}$ is 10, just as for the 16-signal uncoded FIG. 1 constellation. Thus $4\frac{1}{2}$ bits per interval can be sent with the 4-space coded system at the same $\overline{P}$ as 4 bits per interval uncoded.

At the receiver, the received code word (i.e., the two received signal points for each block) may be decoded by determining the most likely two A signal points to have been sent and the most likely two B signal points to have been sent (using 2-dimensional slicing in each modulation interval), and choosing the pair (i.e., the code word) which has the minimum squared distance to the received word.

In other embodiments, decoding is accomplished by making a tentative decision (in each modulation interval) of the most likely signal point to have been sent in that interval (using two-dimensional slicing with the two-dimensional coordinates being rotated 45° with respect to the signal constellation). If the tentative decisions in both intervals are of signal points in the same group, those tentative decisions become the final decision. Otherwise, the tentative decision having the least reliable coordinate is changed to the next nearest signal point (which will be from the other group), and the new tentative decision becomes the final decision.

In other embodiments, maximum likelihood decoding can be accomplished by applying the Viterbi algorithm. Referring to FIG. 13, the encoding process can be characterized by a finite-length 2-state trellis that determines the groups from which signal points are selected in two successive intervals in a manner analogous to FIG. 6. In this case Viterbi algorithm decoding is essentially equivalent to the first decoding method for 4-space codes described above.

Table IV shows the numbers of signals in the constellation and the required signal-to-noise ratios for sending half-integer numbers (between $3\frac{1}{2}$ and $7\frac{1}{2}$) of bits per interval using this 4-space coding system.

TABLE IV

| N | S | $\overline{P}$ | (db) |
|---|---|---|---|
| $3\frac{1}{2}$ | 16 | 5 | 7.0 |
| $4\frac{1}{2}$ | 32 | 10 | 10.0 |
| $5\frac{1}{2}$ | 64 | 21 | 13.2 |
| $6\frac{1}{2}$ | 128 | 41 | 16.1 |
| $7\frac{1}{2}$ | 256 | 85 | 19.3 |

By dividing the groups of signals of the 4-space block coded system into subsets (in the manner previously described), quadrantal differential coding on a block basis can be used in the same manner previously described for the 8-space system.

To send an integral number N bits per interval using 4-space coding, the signal constellations for sending $N+\frac{1}{2}$ bits per interval described earlier in the section headed *Multidimensional Signal Structures for Sending a Non-Integral Number of Bits per Modulation Interval*, are used. In two dimensions, these constellations have $1.5 \times 2^N$ signals, as shown in FIG. 7, for example. Because they are based on a rectangular grid, they may be divided into A and B groups of equal size ($1.5 \times 2^{N-1}$ signals in each) by assigning alternate signals to the two groups. The minimum squared distance between signals in the same group is twice the minimum squared distance between signals in different groups. In coding, one input bit (the group bit) from a block of $2N$ input bits determines whether A or B signals are to be used in both of two intervals. A second input bit determines whether an outer signal is to be used; if not, the remaining $2(N-1)$ bits (taken N-1 at a time) determine the two inner signals of the appropriate group; if so, a third bit determines which interval will contain an outer signal, N-2 bits select which outer signal of the appropriate group, and the remaining N-1 bits select the inner signal of the appropriate group in the other interval. For the same reasons as before, the minimum squared distance between code words is $2d_o^2$. The coding gain is about 1.5 dB. Any of the previously described decoding methods can be used.

Figure 14:
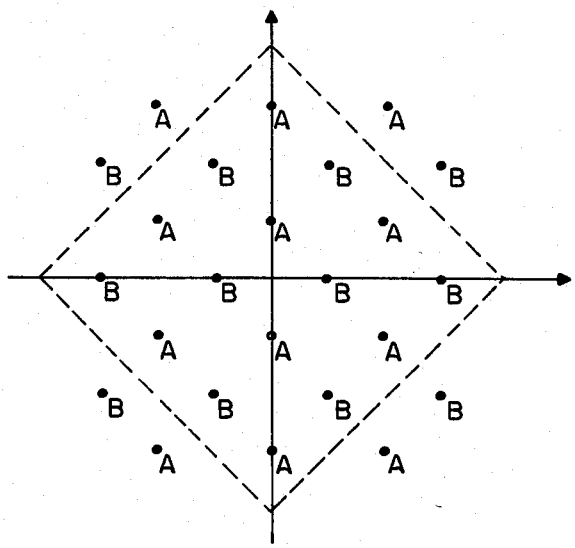
Figure 15:
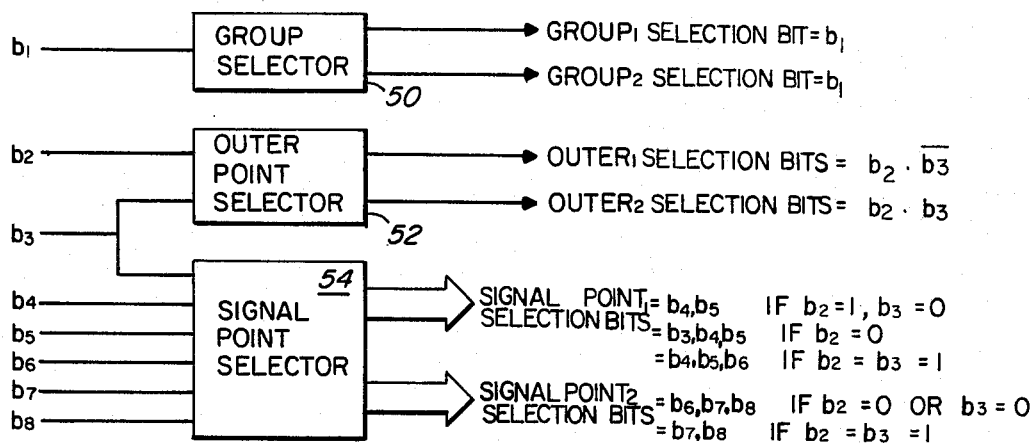

To send 4 bits per interval, the 24-signal FIG. 7 constellation is rotated 45° and divided into A and B groups as well as into inner and outer signals, as shown in FIG. 14. Input bits are grouped into blocks of 8 bits each and each block determines two signal points. Referring to FIG. 15, in the signal selection logic, one bit ($b_1$), the group bit in each block, is used by group selector 50 to specify the group from which both signal points are to be selected, and a second bit ($b_2$) is used by outer point selector 52 to specify whether one of the signal points should be an outer signal. (At most one of the signal points for each block may be an outer signal.) If neither signal point is to be an outer signal, the remaining 6 (i.e., $2(N-1)$) bits ($b_3$-$b_8$) taken three at a time are used by signal point selector 54 to determine which of the eight inner signals of the selected group is to be selected for each modulation interval. If one signal point is to be an outer signal, the third bit, $b_3$, determines which of the two signal points is to be an outer signal and the bits $b_4$-$b_8$ select the outer and inner signal as shown in FIG. 15. (In FIG. 15, the bits $b_2$ and $b_3$ have the same relationship to the values $OUTER_1$ and $OUTER_2$ as did the bits $b_1$ and $b_2$ in FIG. 8.)

The average power required to transmit inner signals is $\bar{P}_{inner}=5$, and to transmit outer signals is $\bar{P}_{outer}=13$. On average, half of the time the two signal points will both be inner signals, and the other half of the time one will be an inner signal and the other an outer signal. The average power required to send both signal points for a block is therefore $\frac{1}{2}(2\times\bar{P}_{inner}) + \frac{1}{2}(\bar{P}_{inner}+\bar{P}_{outer})$ or 14. The required signal-to-noise ratio is then 7 (8.45 dB) per interval compared with 10 (10 dB) required for sending uncoded signal points using the 16-point signal constellation of FIG. 1, a 1.55 dB coding gain.

Theoretically, as shown by Conway and Sloane, the best known 4-space code for sending 4 bits per interval has a required signal-to-noise ratio of 6.75 (8.29 dB). The present embodiment which has a required signal-to-noise ratio of 7 (8.45 db) provides a simpler coding system at a cost of only 0.16 db compared with the best known code for the same parameters. Further, because the code word set has quadrantal symmetry, quadrantal differential coding may be used (as described above) to obtain immunity to phase rotations of multiples of 90°.

Table V shows the numbers of constellation signals S and the required signal-to-noise ratios $\bar{P}$ for sending integer numbers N (from 4 to 7) of bits per interval using this system.

TABLE V

| N | S | $\bar{P}$ | (dB) |
|---|---|---|---|
| 4 | 24 | 7 | 8.45 |
| 5 | 48 | 14.25 | 11.54 |
| 6 | 96 | 28.5 | 14.55 |
| 7 | 192 | 58 | 17.6 |

It can be seen that a coding gain of about 1.5 dB is obtained for all values of N with a signal constellation only 1.5 times the size of that needed for an uncoded system.

Further 8-Space Block Coded Systems

The 4-dimensional signal structures with 2-dimensional constellations like those of FIG. 7 can also be used in 8-space block coded systems by dividing the signals into subsets $A_0$, $A_1$, $B_0$, $B_1$ in the manner described above. The resulting systems send half-integer numbers of bits per modulation interval with about 3.0 dB coding gain over the uncoded 4-dimensional signal structures. Table VI is an extension of Table II showing some of these half-integer systems in relation to the integer systems previously described.

TABLE VI

| N | S | $\bar{P}$ | (dB) |
|---|---|---|---|
| 3 | 16 | 2.5 | 4.00 |
| 3½ | 24 | 3.5 | 5.45 |
| 4 | 32 | 5.0 | 7.00 |
| 4½ | 48 | 7.125 | 8.54 |
| 5 | 64 | 10.5 | 10.22 |
| 5½ | 96 | 14.125 | 11.51 |

16-Space Block Coded Systems

In other embodiments, 16-space block coded modulation systems are used to send an integer number N of bits per modulation interval using FIG. 7-type constellations, or half-integer numbers using FIG. 1-type constellations.

The constellation must be further partitioned into eight equal-sized classes $A_{00}$, $A_{01}$, $A_{10}$, $A_{11}$, $B_{00}$, $B_{01}$, $B_{10}$, $B_{11}$, (i.e., $A_{i,j}$, $B_{i,j}$ for $i=0$, 1, and $j=0$, 1) after first being divided into equal-sized groups A and B and dividing each group into equal-sized subsets $A_0$, $A_1$, and $B_0$, $B_1$. At each step the division is made by taking alternate signals. Furthermore, subsets are divided into two classes with opposite subscripts; e.g., $A_0$ is divided into $A_{00}$ and $A_{11}$, $A_1$ into $A_{01}$ and $A_{10}$, and so forth. The result is that if the minimum squared distance between constellation signals is $d_o^2=d^2(A,B)$, the minimum squared distance between signals in classes in the same group is $2d_o^2$ times the Hamming distance ($d_H$) between their subscripts, e.g., $d^2(A_{00}, A_{01})=2d_o^2$; $d^2(A_{00}, A_{11})=4d_o^2$; and the minimum squared distance between signals in the same class is $8d_o^2$. FIG. 16 shows the 48-signal constellation of FIG. 7 rotated 45° and partitioned in this way.

In coding, one input bit of a block of 8N input bits determines the group (A or B) from which all 8 signal points will be selected. Eleven input bits are coded in a conventional (16, 11) Hamming code (with minimum Hamming distance equal to 4; see, e.g., Berlekamp, cited above) to give 16 coded bits, which are taken two at a time to determine the class subscripts for each signal point. The remaining $8N-12$ input bits select which signal points are used; if N is an integer, by using the 4-dimensional system signal constellations of $1.5\times 2^{N+1}$ signals and taking the bits $2N-3$ at a time to determine pairs of signal points as described above; if N is a half-integer ($N=r+\frac{1}{2}$), then by using 2-dimensional signal constellations of $2^{r+2}$ signals and taking bits $N-3/2=r-1$ at a time to determine signal points from the selected classes.

The minimum squared distance of such 16-space block code words is $8d_o^2$. Two code words with different group bits must differ by at least $d_o^2$ in all 8 signal points. Two code words with the same group bit but different Hamming coded bits must differ in at least four class subscripts, so their squared distance is at least $4\times 2d_o^2$. Two code words with the same group bit and Hamming coded bits have all signal points in the same classes, but must have in at least one interval two different signal points in the same class, which must therefore have squared distance $8d_o^2$. The minimum squared distance between code words is therefore 8 times (or 9 dB)

better than that of the uncoded constellation, but that constellation could without coding send 1 ½ more bits per interval than it can with coding, which is equivalent to about 4.5 dB, so the net coding gain is about 4.5 dB.

An embodiment using the FIG. 16 48-signal constellation to send 4 bits per interval is as follows.

Figure 17:
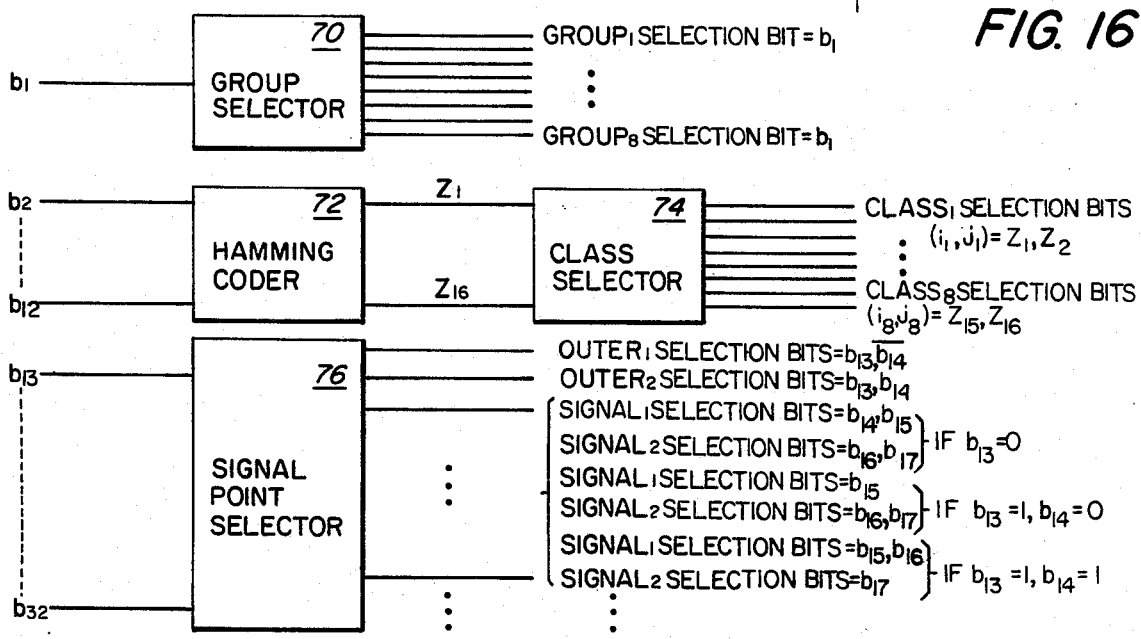

Referring to FIG. 17, 32 input bits are used to select the 8 output signal points as follows. One bit is used by group selector 70 to the determine the group (A or B) from which all signal points will be selected. Eleven bits are coded by Hamming coder 72 using a conventional (16,11) extended Hamming code (with Hamming distance $d_H=4$) into 16 coded bits. Taken in pairs, the 16 coded bits are used by class selector 74 to specify the i,j subscripts of the classes from which the eight output signal points are respectively selected. The remaining 20 bits (taken 5 at a time) are used by signal point selector 76 to select pairs of signal points of appropriate classes, where each class comprises 6 signals, 4 inner and 2 outer, and selection between inner and outer signals is made in the same manner as previously described. (In FIG. 17, the bits $b_{13}$ and $b_{14}$, $b_{18}$ and $b_{19}$, etc., have the same relationship to the values $OUTER_1$ and $OUTER_2$ as did the bits $b_1$ and $b_2$ in FIG. 8.)

The required signal-to-noise ratio is 3.5625 or 5.5 dB, a 4.5 dB gain over the uncoded N=4 constellation of FIG. 1.

Table VII shows the number of signals S in the constellation and the required signal-to-noise ratio $\overline{P}$ for sending integer and half-integer numbers N (between 2 ½ and 6 ½ ) of bits per interval in blocks of 8 intervals each, using the 16-space coding system described above and the signal constellations of FIGS. 1 and 7.

TABLE VII

| N | S | $\overline{P}$ | (dB) |
|---|---|---|---|
| 2½ | 16 | 1.25 | 1.0 |
| 3 | 24 | 1.75 | 2.5 |
| 3½ | 32 | 2.5 | 4.0 |
| 4 | 48 | 3.56 | 5.5 |
| 4½ | 64 | 5.25 | 7.2 |
| 5 | 96 | 7.13 | 8.5 |
| 5½ | 128 | 8.25 | 10.1 |
| 6 | 192 | 14.5 | 11.6 |
| 6½ | 256 | 21.25 | 13.3 |

In the signal constellations for the 16-space block coding systems, each signal is a member of a quadruplet of signals at the same radius from the origin and separated by intervals of 90° about the origin. (For example, the points marked 60 and 62 in FIG. 16 form such quadruplets.) Because all such quadruplets are of one or the other forms shown in FIG. 18, quadrantal differential coding (in the manner previously described) can be used with the group bit and an appropriate one of the class subscript bits (in this case the second for A and the first for B, inverted) in place of the group and subset bits used in 8-space coding, but otherwise as previously described.

24-Space Block Coded Systems

In other embodiments, 24-space block coded systems can be used to send an integer number of bits per interval using FIG. 1-type constellations, or a half-integer number of bits per interval using FIG. 7-type constellations.

To send N bits per interval, N an integer, a constellation of $2^{N+2}$ signals on a rectangular grid (such as one of those of FIG. 1) is used. The constellation is divided into 16 subclasses $A_{ijk}$, $B_{ijk}$ (i,j,k=0 or 1) by further subdivision of the classes $A_{ij}$ and $B_{ij}$ defined in the previous section by taking alternate signals in accordance with a pattern defined below. The minimum squared distance between signals in different groups is then $d_o^2$, between signals in the same group but different subsets is $2d_o^2$, in the same subset but different classes is $4d_o^2$, in the same class but different subis is $8d_o^2$, and finally between signals in the same subclass is $16d_o^2$.

Referring to FIG. 19, the 64-signal constellation of FIG. 1 has been partitioned into 16 4-point subclasses (for use with a 24-space block coding system). In general, a partition of any rectangular-grid constellation into subclasses using the pattern of subscripts shown in FIG. 19 may be used.

In coding, one input bit of a block of 12N bits determines the group (A or B) from which all 12 signal points will be selected. Twelve input bits are coded in the (24, 12) Golay code (which has minimum Hamming distance 8; see, e.g., Berlekamp, cited above) to give 24 coded bits, which are taken two at a time to give the (i, j) subscripts of the subclass from which each signal point is to be selected. Eleven input bits determine the k subscripts for the first 11 points, and the 12th k subscript is chosen so that the 12 k subscripts have even parity (an even number are equal to 1) for A code words and odd parity for B code words. The remaining 12N−24 bits are taken N−2 at a time to select one of the $2^{N-2}$ signals of the selected subclass for each of the 12 intervals.

With this construction, the minimum squared distance between code words is $16d_o^2$, where $d_o^2$ is the minimum squared distance between signals in the constellation. This is 12 dB better than the uncoded constellation having $2^{N+2}$ signals, but that constellation without coding could send 2 bits per interval more than with this coding, which is equivalent to about 6 dB, so the net coding gain is about 6 dB.

Figure 20:
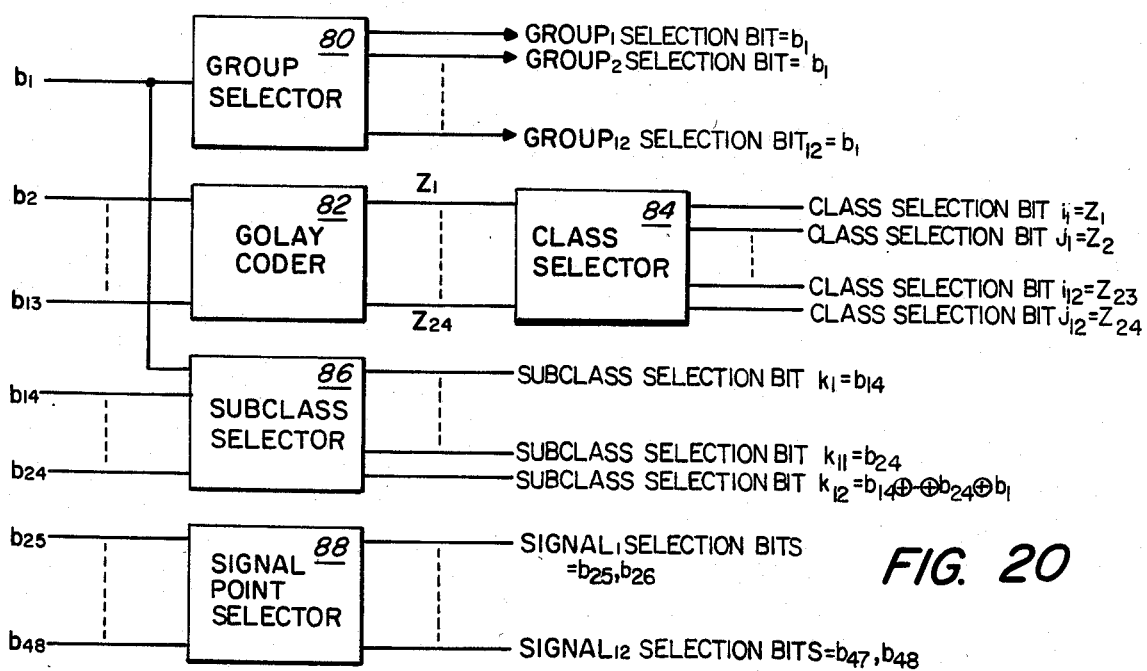

One embodiment, using the FIG. 19 constellation to send 4 bits per interval, is as follows. Referring to FIG. 20, 48 input bits are used to select 12 output signal points as shown. One bit is used by group selector 80 to determine the group (A or B) from which all signal points will be selected. Twelve bits are coded by Golay coder 82 using a conventional (24, 12) Golay code (with Hamming distance $d_H=8$) into 24 coded bits. Taken in pairs, the 24 coded bits are used by class selector 84 to specify the (i, j) subscripts of the 12 signals to be selected. Eleven bits and the group bit are used by subclass selector 86 to specify the k subscripts of the 12 points, with 11 subscripts equal to the corresponding bits, and the 12th subscript a parity check on these 11 bits plus the group bit. The remaining 24 bits, taken two at a time, are used by signal point selector 88 to select one of the four signals in each selected subclass.

The required signal-to-noise ratio with this system is 2.625 or 4.2 dB, 5.8 dB better than with the uncoded N=4 constellation of FIG. 1.

Table VIII shows the numbers of signals in the constellation and the required signal-to-noise ratios $\overline{P}$ for sending integer numbers N (between 2 and 6) of bits per interval in blocks of 12 intervals, using the 24-space coding described above and the signal constellations of FIG. 1. (The constellations of FIG. 7 could be used to send half-integer numbers of bits per interval with similar coding gain.)

TABLE VIII

| N | S | $\bar{P}$ | (dB) |
|---|---|---|---|
| 2 | 16 | .625 | −2.0 |
| 3 | 32 | 1.255 | 1.0 |
| 4 | 64 | 2.625 | 4.2 |
| 5 | 128 | 5.125 | 7.1 |
| 6 | 256 | 10.625 | 10.3 |

In the signal constellations for these 24-space block coded modulation systems, each signal is a member of a quadruplet of signals of the same radius and separated by phase intervals of 90°. (For example, the signals marked 90, 92, 94, and 96 in FIG. 19 form such quadruplets, respectively.) All such quadruplets are of one of the four types shown in FIG. 21, and therefore quadrantal differential coding (in the manner previously described) can be used with the group bit and an appropriate subscript bit (in this case the first for A; and the second for B, inverted) in place of the group and subset bits used in 8-space coding, but otherwise as previously described.

Block Coded Systems of Other Numbers of Dimensions

In other embodiments, block coded systems in 2m-space can be derived from the 4-space and 8-space block coded systems.

The 4-space system can be extended to a 2m-space system that sends N−1/m bits per interval or mN−1 bits per block (for any m greater than or equal to 2) if N is an integer, or for any even m greater than or equal to 2 if N=r+½ is a half-integer number. In the former case the signal constellation of size $2^N$ is used, and in the latter the constellation of $1.5 \times 2^r$ signals divided into inner and outer signals as previously described. In either case the constellation is divided into A and B groups as previously described. The encoder is arranged so that in the first m−1 intervals, either A or B signals may be sent, but in the last interval, the group must be constrained to satisfy a parity condition (e.g., that the total number of A signals be even). For example, the groups may be selected by a two-state trellis encoder operating according to the m-interval trellis of FIG. 22. Otherwise selection of signals within the groups is as previously described. Decoding may be by the Viterbi algorithm.

The minimum squared distance between code words remains $2d_o^2$ in this system because of the parity condition and the fact that the minimum squared distance between signals within the same group is at least twice the minimum squared distance between signals in different groups. However, the number of bits transmitted per interval is now only 1/m less than in an uncoded system using the same constellation, so that the coding gain is approximately 3(1−1/m) dB, which approaches 3 dB for m large. For example, for m=4, an 8-space coded modulation system with coding gain of about 2.25 dB is obtained.

The 8-space system can be extended to a 2m-space system that sends N bits per interval for any m greater than or equal to 4 and any integer N, using a signal constellation of $2^{N+1}$ signals divided into 4 equal-sized subsets as previously described. The encoder is arranged so that all m points are chosen from the same group, the first m−1 points being from either subset of that group, and the final point being chosen from a subset selected to satisfy a parity condition (e.g., that the total number of 1 subscripts be even). For example, the subsets may be selected by a 4-state trellis encoder that operates according to the m-interval trellis of FIG. 23. Otherwise selection of signals within subsets is as previously described. Decoding may be done using the Viterbi algorithm using the FIG. 23 trellis.

The minimum squared distance between code words remains $4d_o^2$ in this system because m is greater than or equal to 4, there is a parity condition on subsets combined with the between-subset distance of $2d_o^2$, and there is a within-subset distance of $4d_o^2$. The number of bits per interval is N for any value of m, so the coding gain remains about 3 dB. However, for m greater than 4 the number of near neighbors of any code word is reduced since code words of the opposite group have distance at least $md_o^2$ and are thus no longer near neighbors, reducing the error event probability coefficient by about a factor of 2.

Other Embodiments

Other embodiments are within the following claims. For instance, the input bits can undergo any transformation which does not result in loss of information (such as scrambling, permutation, or binary linear transformations) before being encoded. The digital data to be sent can be in characters other than bits. The output signal points or indeed their coordinates can be arbitrarily permuted without loss of coding gain. The coordinates can be used individually in one-dimensional modulation systems (such as single side-band or vestigial-sideband modulation systems), or in groups of appropriate dimension in multidimensional modulation systems. Other signal constellations (including ones not based on rectangular grids) can be used provided that their signals can be partitioned into equal-sized groups (subsets, classes, subclasses) having at least approximately the desired distance properties described earlier. Any 2m-dimensional orthogonal linear transformation of output signal points may be made without affecting relative distance properties in 2m-space. Quadrantal differential coding can be done using any method such that 90° rotations of code words change only quadrantal phase bits, and such phase bits are encoded differentially (mod 4) with reference to any previously transmitted quadrantal phase bits. Multidimensional signal constellations for any binary fractional numbers of bits per interval as described herein, may be used with the block coded modulation systems provided that parameters are consistent.

I claim:

1. A modulation system for sending digital data over a band-limited channel in accordance with a code word corresponding to a plurality of modulation signal points drawn from a constellation of available signals, said code word being selected from an available set of said code words on the basis of a block of said digital data, the code words belonging to said available set for said block being independent of said signal points corresponding to the code word selected for any other said block, said system comprising an encoder for selecting said code word, said constellation comprising groups having equal numbers of said signals, said encoder being arranged so that the group from which at least one said signal point for said block is drawn depends on the group from which at least one other said signal point for said block is drawn, and a modulator for sending said signal points over said channel, said signal points being two-dimensional, said code words being 2m-dimensional, m being the number of said signal points corresponding to each said code word, m being greater than two, each said block of said digital data comprising mN bits.

2. The improvement of claim 1 wherein said signals are arranged in said constellation so that the minimum squared distance between two said signals belonging to the same said group is greater than between two said signals belonging to different said groups.

3. The improvement of claim 1 wherein said signals of said constellation are arranged on a rectangular grid.

4. The improvement of claim 1 wherein the minimum squared distance between two said signal points belonging to the same said group is twice the minimum squared distance between two said signal points belonging to different said groups.

5. The improvement of claim 1 wherein each said block comprises a plurality of bits, and the said groups from which said signal points for said block are drawn are determined by a single said bit of said block.

6. The improvement of claim 1 wherein $N = r + \frac{1}{2}$, r being an integer, and said constellation comprises $2^{r+1}$ signals.

7. The improvement of claim 1 wherein said encoder further arranged so that $m-1$ said signal points for each said block may be drawn from among all said signals in said constellation, and the one remaining said signal point for said block is drawn from a group that depends on the groups from which said $m-1$ signal points are drawn.

8. A modulation system for sending digital data over a band-limited channel in accordance with a code word corresponding to a plurality of modulation signal points drawn from a constellation of available signals, said code word being selected from an available set of said code words on the basis of a block of said digital data, the code words belonging to said available set for said block being independent of said signal points corresponding to the code word selected for any other said block, said system comprising an encoder for selecting said code word, said constellation comprising groups having equal numbers of said signals, said encoder being arranged so that the group from which at least one said signal point for said block is drawn depends on the group from which at least one other said signal point for said block is drawn, and a modulator for sending said signal points over said channel, said signal points being two-dimensional, said code words being 2m-dimensional, m being the number of said signal points corresponding to each said code word, each said block of said digital data comprising mN bits, N being an integer representing the number of bits of said digital data per signaling interval, m being an even integer no smaller than 2, said constellation comprising $1.5 \times 2^N$ signals.

9. The improvement of claim 8 wherein m is 2 and N is 4.

10. A modulation system for sending digital data over a band-limited channel in accordance with a code word corresponding to a plurality of modulation signal points drawn from a constellation of available signals, said code word being selected from an available set of said code words on the basis of a block of said digital data, the code words belonging to said available set for said block being independent of said signal points corresponding to the code word selected for any other said block, said system comprising an encoder for selecting said code word, said constellation comprising groups having equal numbers of said signals, said encoder being arranged so that the group from which at least one said signal point for said block is drawn depends on the group from which at least one other said signal point for said block is drawn, and a modulator for sending said signal points over said channel, said signal points being two-dimensional, said code words being 2m-dimensional, m being the number of said signal points corresponding to each said code word, and wherein said encoder is further arranged so that $m-1$ said signal points for each said block may be drawn from amount all said signals in said constellation, and the one remaining said signal point for said block is drawn from a group that depends on the groups from which said $m-1$ signal points are drawn, and wherein said group from which said one remaining signal point is drawn depends on a single-parity-check code based on at least one of said bits.

11. A modulation system for sending digital data over a band-limited channel in accordance with a code word corresponding to a plurality of modulation signal points drawn from a constellation of available signals, said code word being selected from an available set of said code words on the basis of a block of said digital data, the code words belonging to said available set for said block being indepedent of said signal points corresponding to the code word selected for any other said block, said system comprising an encoder for selecting said code word, said constellation comprising groups having equal numbers of said signals, said encoder being arranged so that the group from which at least one said signal point for said block is drawn depends on the group from which at least one other said signal point for said block is drawn, and a modulator for sending said signal points over said channel, said signal points being two-dimensional, said code words being 2m-dimensional, m being the number of said signal points corresponding to each said code word, and wherein said encoder is further arranged so that $m-1$ said signal points for each said block may be drawn from among all said signals in said constellation, and the one remaining said signal point for said block is drawn from a group that depends on the groups from which said $m-1$ signal points are drawn, and wherein said group from which said one remaining signal point is drawn is determined by said encoder based on a state-transition trellis for said block.

12. A modulation system for sending digital data over a band-limited channel in accordance with a code word corresponding to a plurality of modulation signal points drawn from a constellation of available signals, said code word being selected from an available set of said code words on the basis of a block of said digital data, the code words belonging to said available set for said block being independent of said signal points corresponding to the code word selected for any other said block, said system comprising an encoder for selecting said code word,
said constellation comprising groups having equal numbers of said signals, said groups each comprising subsets having equal numbers of said signals,
said encoder being arranged so that the group and subset from which at least one said signal point for said block is drawn depends on the group and subset from which at least one other said signal point for said block is drawn, and
a modulator for sending said signal points over said channel.

13. The improvement of claim 12 wherein said signals are arranged in said constellation so that the minimum squared distance between two signals belonging to one said subset is greater than between two said signals belonging to different said subsets within the same said group.

14. The improvement of claim 12 wherein said signal points are 2-dimensional, said code words are 2m-dimensional, m being the number of said signal points corresponding to each said code word, and each said block of said digital data comprises mN bits.

15. The improvement of claim 12 wherein said signals of said constellation are arranged on a rectangular grid.

16. The improvement of claim 12 wherein the minimum squared distance between two said signal points belonging to the same said subset is twice the minimum squared distance between two said signal points belonging to different said subsets.

17. The improvement of claim 12 wherein each said block comprises a plurality of bits, and the subsets from which said signal points for said block are drawn are determined based on a plurality of bits representing less than all of said digital data of said block.

18. The improvement of claim 14 wherein N is an integer, m is at least 4, and said constellation comprises $2^{N+1}$ said signals.

19. The improvement of claim 14 wherein $N=r+\frac{1}{2}$, r being an integer, m is an even integer no smaller than 4, and said constellation comprises $1.5 \times 2^{r+1}$ signals.

20. The improvement of claim 14 wherein said encoder is further arranged so that one said signal point for each said block may be drawn from among all said signals in said constellation, $m-2$ of said signal points are drawn from groups that depend on the group from which said one signal point is drawn, and the single remaining said signal point for said block is drawn from a subset that depends on the subsets from which said one signal point and said $m-2$ signal points are drawn.

21. The improvement of claim 20 wherein said subset from which said single remaining signal is drawn depends on a single-parity-check code based on at least one of said bits.

22. The improvement of claim 20 in which said subsets from which said signal points for said block are drawn are determined by said encoder based on a state-transition trellis for said block.

23. The improvement of claim 20 wherein said subsets and said groups from which said signal points for said block are drawn are determined by said encoder based on a Hamming code applied to at least one of said bits.

24. The improvement of claim 14 wherein m is 4.

25. The improvement of claim 20 wherein m is 4.

26. The improvement of claim 18 wherein m is 4 and N is 4.

27. The improvement of claim 12 wherein said subsets each comprise classes having equal numbers of said signals, and
said encoder is further arranged so that said class from which at least one signal point for said block is drawn depends on the class from which at least one other said signal point for said block is drawn.

28. The improvement of claim 27 wherein said signals are arranged in said constellation so that the minimum squared distance between two signals belonging to one said class is greater than between two said signals belonging to different said classes within the same said subset.

29. The improvement of claim 27 wherein said signal points are 2-dimensional, said code words are 2m-dimensional, m being the number of said signal points corresponding to each said code word, and said block of said digital data comprises mN bits.

30. The improvement of claim 27 wherein said signals of said constellation are arranged on a rectangular grid.

31. The improvement of claim 27 wherein the minimum squared distance between two said signal points belonging to the same said class is twice the minimum squared distance between two said signal points belonging to different said classes.

32. The improvement of claim 27 wherein each said block comprises a plurality of bits, and the classes from which said signal points for said block are drawn are determined based on a plurality of bits representing less than all of said digital data of said block.

33. The improvement of claim 29 wherein m is 8.

34. The improvement of claim 33 wherein N is an integer and said constellation comprises $1.5 \times 2^{N+1}$ said signals.

35. The improvement of claim 33 wherein $N=r+\frac{1}{2}$, r being an integer, and said constellation comprises $2^{r+2}$ signals.

36. The improvement of claim 29 or 32 wherein said classes from which said signal points for said block are drawn are determined by said encoder based on a Hamming code applied to at least one of said bits.

37. The improvement of claim 33 wherein N is 4.

38. The improvement of claim 27 wherein
said classes each comprise subclasses having equal numbers of said signals, and
said encoder is further arranged so that said subclass from which at least one signal point for said block is drawn depends on the subclass from which at least one other said signal point for said block is drawn.

39. The improvement of claim 38 wherein said signals are arranged in said constellation so that the minimum squared distance between two signals belonging to one said subclass is greater than between two said signals belonging to different said subclasses within the same said class.

40. The improvement of claim 38 wherein said signal points are 2-dimensional, said code words are 2m-dimensional, m being the number of said signal points corresponding to each said code word, and said block of said digital data comprises mN bits.

41. The improvement of claim 38 wherein said signals of said constellation are arranged on a rectangular grid.

42. The improvement of claim 38 wherein the minimum squared distance between two said signal points belonging to the same said subclass is twice the minimum squared distance between two said signal points belonging to different said subclasses.

43. The improvement of claim 38 wherein each said block comprises a plurality of bits, and the subclasses from which said signal points for said block are drawn are determined based on a plurality of bits representing less than all of said digital data of said block.

44. The improvement of claim 40 wherein m is 12.

45. The improvement of claim 44 wherein N is an integer and said constellation comprises $2^{N+2}$ said signals.

46. The improvement of claim 40 or 43 wherein said subclasses from which said signal points for said block are drawn are determined by said encoder based on a Golay code applied to at least one of said bits.

47. The improvement of claim 48 wherein N is 4.

48. The improvement of claim 1, 8, 11, 12, 16, 27, or 38 further comprising means for selecting at least one said signal point of said block on the basis of less than all said digital data in said block.

49. The improvement of claim 1, 8, 11, 12, 27 or 38 wherein said constellation comprises quadruplets each having four said signals, the signals belonging to each said quadruplet being located at the same distance from the origin but separated by 90° intervals about said origin, said digital data comprises bits, and at least two of said bits are quadrantally differentially encoded.

50. The improvement of claim 49 wherein said groups each comprise subsets having equal numbers of said signals and said four signals belonging to each quadruplet are drawn from four different said subsets.

51. The improvement of claim 1, 8, 11, 12, 27 or 38 further comprising a decoder arranged to decide which code word was sent based on maximum likelihood sequence estimation in accordance with the Viterbi algorithm.

52. The improvement of claim 1, 8, 27 or 38 further comprising a demodulator having a decoder arranged to make tentative decisions about which signal point was sent prior to final decoding of all of the received signal points for a block, and said demodulator comprises adaptive control circuitry arranged to be responsive to said tentative decision.

53. The improvement of claim 1, 8, 12, 27 or 38 wherein said digital data comprises bits and the selection of said signal points for a block depends on a single-parity-check code based on at least one of said bits.

54. The improvement of claim 53 further comprising a decoder arranged to decide which said code word was sent by first making a tentative decision as to each signal point in said code word without regard to whether said parity check is satisfied, and accepting said tentative decisions as the final decision, either without changes if said parity check is satisfied, or after changing the least reliable one of said tentative decisions if said parity check is not satisfied.

55. A modulation system for sending a block of digital data bits over a band-limited channel using a plurality of modulation signal points drawn from a two-dimensional constellation of available signals, said system comprising an encoder for selecting said signal points based on said bits, said constellation comprising a plurality of inner signals, and a plurality of outer signals located farther from the origin than said inner signals, one bit of said digital data determining whether any of said plurality of signal points will be drawn from said outer signals, if an outer signal will be drawn, at least one other bit of said digital data determining which of said plurality of signals points will be an outer signal point and a modulator for sending said signal points over said channel.

56. The improvement of claim 55 wherein there are $2^t$ said signal points, said digital data comprises at least $t+1$ bits, there are S said inner signals and $2^{-t}S$ said outer signals, and t said bits determine which of said plurality of signal points will be an outer signal point.

57. The improvement of claim 56 wherein said signals of said constellation are arranged on a rectangular grid.

58. The improvement of claim 56 wherein said constellation comprises quadruplets each having four said signals, the signals belonging to each said quadruplet being located at the same distance from the origin but separated by 90° intervals about the origin of a signal plane, and at least two of said bits are quadrantally differentially encoded.

59. The improvement of claim 56 wherein t=1.

60. The improvement of claim 59 wherein said block comprises 2N+1 said bits and S is $2^N$.

61. The improvement of claim 60 N−1 of said bits determine which said outer signal is drawn, and N of said bits determine which inner signal is drawn.

62. The improvement of claim 59 wherein N is 4.

63. The improvement of claim 56 wherein t is 2.

64. The improvement of claim 63 wherein said block comprises 4N+1 bits and S is $2^N$, N being an integer.

65. The improvement of claim 63 wherein in said block comprises 4N+3 bits and S is $1.5 \times 2^N$, N being an integer.

66. The improvement of claim 64 wherein N−2 of said bits determine which said outer signal is drawn and N of said bits determine which inner signal is drawn.

* * * * *

UNITED STATES PATENT AND TRADEMARK OFFICE
CERTIFICATE OF CORRECTION

PATENT NO. : 4,597,090
DATED : June 24, 1986
INVENTOR(S) : George D. Forney, Jr.

It is certified that error appears in the above-identified patent and that said Letters Patent are hereby corrected as shown below:

Col. 1, line 8, "generically" should be --generally--

Col. 5, line 3, before "being an", insert --N--;

Col. 11, line 56, "$(A_1, B_0)=2$" should be --$(A_1, B_0)=d^2$--;

Col. 12, line 31, "$4_0^2$" should be --$4d_0^2$--;

Col. 12, line 65, "f-3 dB" should be --fx3 db--;

Col. 13, line 37, before "In FIG. 8,", insert --(--;

Col. 13, line 39, "$(OUTER_a=0)$" should be --$(OUTER_1=0)$--;

Col. 20, line 7, "subis" should be --subclasses--;

Col. 23, line 27, "wherein said encoder further arranged" should be --wherein said encoder is further arranged--;

UNITED STATES PATENT AND TRADEMARK OFFICE
CERTIFICATE OF CORRECTION

PATENT NO. : 4,597,090

DATED : June 24, 1986

INVENTOR(S) : George D. Forney, Jr.

It is certified that error appears in the above-identified patent and that said Letters Patent are hereby corrected as shown below:

Col. 24, line 23, "amount" should be --among--;

Col. 28, line 42, before "N-1", insert --wherein--;

Col. 28, line 49, delete "in" before "said".

Signed and Sealed this

Seventh Day of October, 1986

[SEAL]

Attest:

DONALD J. QUIGG

*Attesting Officer*     *Commissioner of Patents and Trademarks*